US008994439B2

(12) United States Patent
Kaneyasu et al.

(10) Patent No.: US 8,994,439 B2
(45) Date of Patent: Mar. 31, 2015

(54) SEMICONDUCTOR DEVICE, IMAGE DISPLAY DEVICE, STORAGE DEVICE, AND ELECTRONIC DEVICE

(71) Applicant: Semiconductor Energy Laboratory Co., Ltd., Atsugi-shi, Kanagawa-ken (JP)

(72) Inventors: Makoto Kaneyasu, Hadano (JP); Kouhei Toyotaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/862,932

(22) Filed: Apr. 15, 2013

(65) Prior Publication Data

US 2013/0278324 A1    Oct. 24, 2013

(30) Foreign Application Priority Data

Apr. 19, 2012 (JP) ................................. 2012-095755

(51) Int. Cl.
*H03K 17/16* (2006.01)
*G09G 3/36* (2006.01)
*G09G 3/32* (2006.01)
*H03K 3/012* (2006.01)

(52) U.S. Cl.
CPC .............. *H03K 3/012* (2013.01); *G09G 3/3266* (2013.01); *G09G 3/3677* (2013.01); *G09G 2300/0842* (2013.01); *G09G 2310/0291* (2013.01); *G09G 2330/021* (2013.01)
USPC ............................ 327/390; 327/589; 345/100

(58) Field of Classification Search
USPC ................................... 327/390, 589; 345/100
See application file for complete search history.

(56) References Cited

U.S. PATENT DOCUMENTS

| 5,084,634 | A | * | 1/1992 | Gorecki .......................... 327/91 |
| 6,380,792 | B1 | * | 4/2002 | Yamamoto .................... 327/390 |
| 6,788,108 | B2 | | 9/2004 | Miyake et al. |
| 6,975,142 | B2 | | 12/2005 | Azami et al. |
| 7,057,598 | B2 | | 6/2006 | Azami et al. |
| 7,202,863 | B2 | | 4/2007 | Kimura et al. |
| 8,525,574 | B1 | * | 9/2013 | Duggal ......................... 327/390 |
| 2008/0226013 | A1 | | 9/2008 | Deane |
| 2011/0140108 | A1 | | 6/2011 | Kimura et al. |
| 2011/0215787 | A1 | | 9/2011 | Shionoiri et al. |
| 2012/0286263 | A1 | | 11/2012 | Miyake |
| 2013/0082760 | A1 | | 4/2013 | Umezaki |
| 2013/0162305 | A1 | | 6/2013 | Watanabe |

FOREIGN PATENT DOCUMENTS

JP      08-234683 A    9/1996
WO   WO-2007/080813   7/2007

* cited by examiner

*Primary Examiner* — Kenneth B. Wells
(74) *Attorney, Agent, or Firm* — Eric J. Robinson; Robinson Intellectual Property Law Office, P.C.

(57) ABSTRACT

A semiconductor device which has reduced power consumption and includes a selection transistor is provided. A semiconductor device in which the number of wirings and terminals for inputting a power supply potential is reduced and which operates at high speed is provided. A buffer circuit connected to a gate line connected to a gate of the selection transistor has a function of generating a potential higher than a high power supply potential by using the high power supply potential and outputs the potential depending on the selection signal. A bootstrap circuit boosts a high power supply potential that is input to an inverter that is the closest to an output side among a plurality of inverters included in a buffer circuit. Further, by providing a delay circuit in the buffer circuit, the bootstrap circuit starts to boost a potential at the timing later than the input of the selection signal.

14 Claims, 19 Drawing Sheets

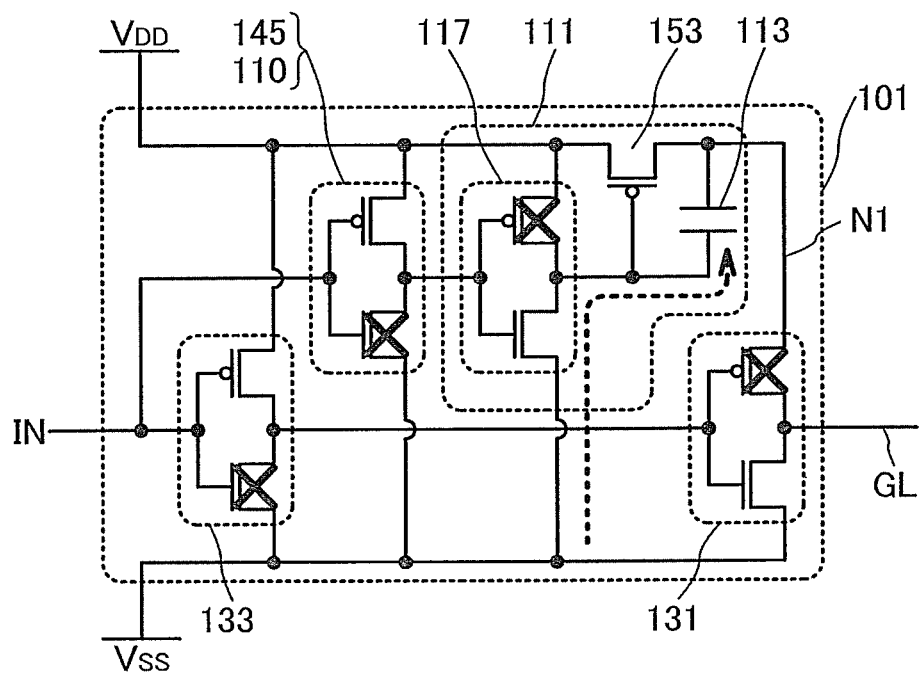
FIG. 7A [Non-Selected Period (T0)]
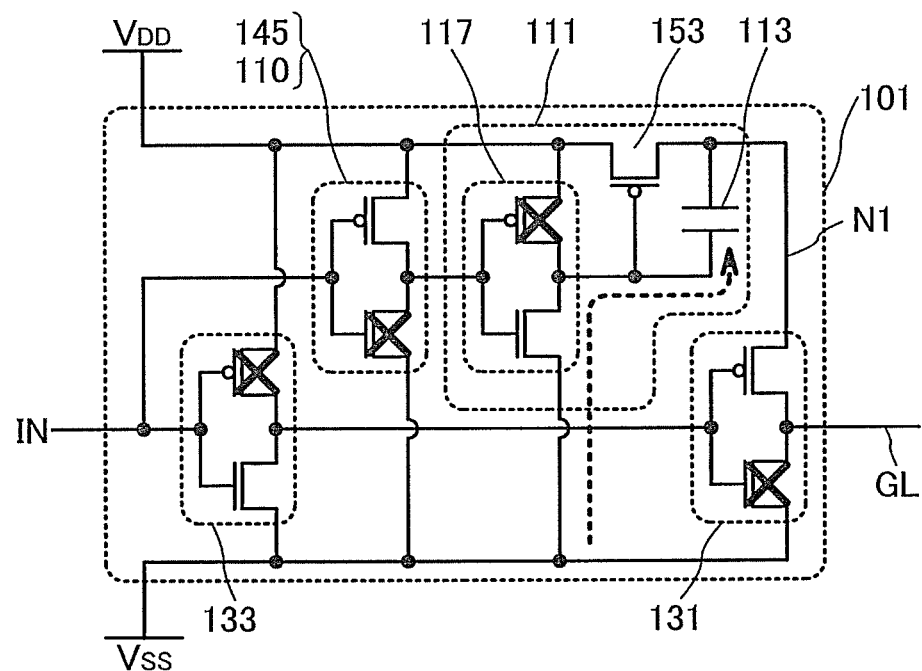
FIG. 7B [Delay Period (T1)]

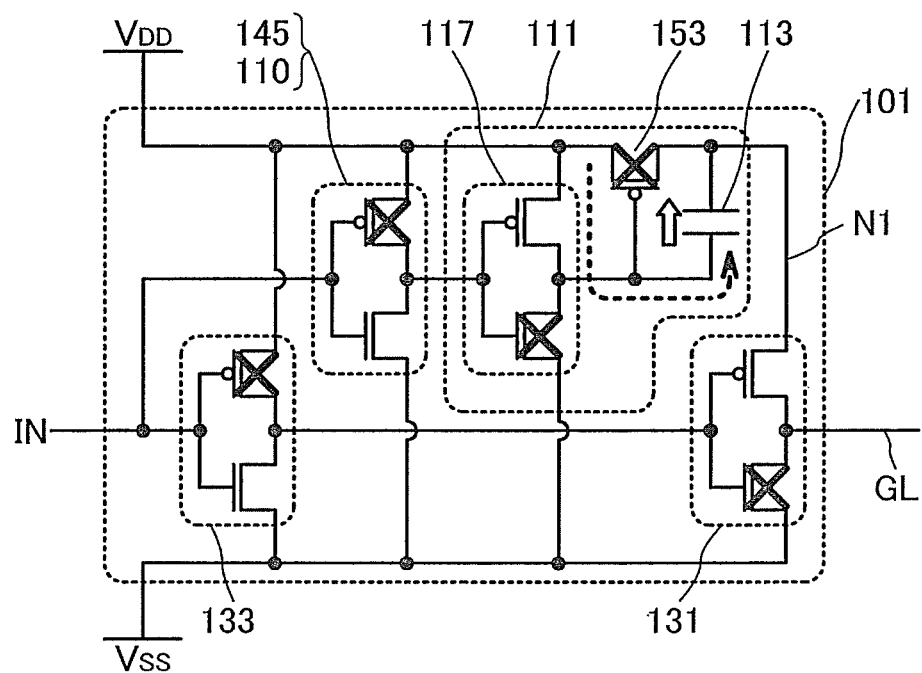
[ Selected Period (T2) ]   FIG. 8

SEMICONDUCTOR DEVICE, IMAGE DISPLAY DEVICE, STORAGE DEVICE, AND ELECTRONIC DEVICE

BACKGROUND OF THE INVENTION

1. Field of the Invention

The present invention relates to a semiconductor device. The present invention relates to an image display device, a storage device, and an electronic device each including the semiconductor device.

In this specification or the like, a semiconductor device means all types of devices that can function by utilizing semiconductor characteristics, and a transistor, a semiconductor circuit, and the like are embodiments of semiconductor devices.

2. Description of the Related Art

Semiconductor devices that include a plurality of functional circuits including selection transistors are known. The selection transistors are applied to image display devices including a display element such as a liquid crystal element, an organic electroluminescent (EL) element, or an electrophoretic element, storage devices including storage elements such as a dynamic random access memory (DRAM) element and a static random access memory (SRAM) element, and the like.

For example, as a display device to which a selection transistor is applied, a display panel using an organic EL medium is disclosed in Patent Document 1.

As the selection transistor, an n-channel transistor is often used. Some of the reasons are as follows: an n-channel transistor can operate at high speed because electrons with high mobility are used as carriers, and is suitable for miniaturization because large current can flow through even a relatively small n-channel transistor.

In recent years, small portable devices such as a mobile phone and a tablet terminal have been developed. Since these devices are powered by a battery, lower power consumption has been desired. In order to make the devices smaller, it has been also desired to reduce the number of circuit elements included in the devices and wirings for connecting the circuit elements as much as possible.

Further, an increased drive frequency of the semiconductor devices has been desired. In an image display device, for example, in order to improve its display quality, it has been examined to increase the number of pixels or perform high-speed display (e.g., at double speed or quad speed). In a storage device, for example, high-speed data writing or data reading has been required.

REFERENCE

Patent Document

[Patent Document 1] Japanese Published Patent Application No. H8-234683

SUMMARY OF THE INVENTION

As described above, an n-channel transistor is often used as a selection transistor included in a functional circuit. When a predetermined potential is written to a functional element through a selection transistor, a potential that is sufficiently higher than a potential to be written to the functional circuit needs to be input to a gate of the selection transistor in order to turn on the selection transistor surely.

For example, in the case where a potential to be input to a gate of the selection transistor is the same as a potential to be written, an on-state resistance of the selection transistor cannot be sufficiently reduced, which causes a delay. Thus, the drive frequency cannot be increased. Moreover, at this time, a potential written through the selection transistor might be decreased from the potential input to the gate of the selection transistor by the threshold voltage of the selection transistor.

Accordingly, it is needed to provide a power supply circuit for generating a potential to be input to the gate and a wiring or a terminal for supplying the potential from the power supply circuit additionally, which is one factor inhibiting reduction in power consumption or size of an electronic device.

The present invention is made in view of the foregoing technical background. Thus, it is an object of one embodiment of the present invention to provide a semiconductor device with reduced power consumption that includes a selection transistor. Another object is to provide in which the number of wirings and terminals for inputting a power supply potential is reduced and which operates at high speed.

One embodiment of the present invention solves at least one of the above objects.

In order to achieve any of the above objects, the present invention focuses on a configuration of a buffer circuit connected to a gate line connected to a gate of a selection transistor. The buffer circuit may have a function of generating a potential higher than a high power supply potential by using the high power supply potential, and may output the potential depending on a selection signal.

That is, one embodiment of the present invention is a semiconductor device which includes a functional circuit including a selection transistor and a buffer circuit electrically connected to a gate of the selection transistor through a first signal line. The buffer circuit includes first to n-th inverters that are sequentially connected in series, a bootstrap circuit, and a delay circuit. An input terminal of the first inverter is electrically connected to a wiring to which a selection signal is input. An output terminal of the n-th inverter is electrically connected to the first signal line. High-potential input terminals of the first to (n−1)th inverters are electrically connected to a second signal line to which a first potential is input. Low-potential input terminals of the first to n-th inverters are electrically connected to a third signal line to which a second potential lower than the first potential is input. Here, depending on the selection signal, the delay circuit outputs a delay signal which is delayed compared to the selection signal to the bootstrap circuit. The bootstrap circuit outputs a third potential higher than the first potential to the high-potential input terminal of the n-th inverter in response to the delay signal.

In the semiconductor device having such a configuration, the bootstrap circuit boosts a high power supply potential that is input to an inverter that is positioned to be the closest to an output side among the plurality of inverters included in the buffer circuit.

Further, by providing a delay circuit in the buffer circuit, the bootstrap circuit starts to boost a potential at the timing later than the input of the selection signal.

Here, the selection signal is input to the buffer circuit; then, a predetermined potential (close to the first potential) is input to the gate line (the first signal line), and after that, the bootstrap circuit boosts the potential of the gate line. Thus, the buffer circuit can output a potential (the third potential) higher than the predetermined potential to the gate line.

Such a method in which the bootstrap circuit boosts the potential after the predetermined potential is supplied to the gate line allows efficient boosting and reduction of the capacitance of a capacitor included in the bootstrap circuit. For example, the capacitance of the capacitor included in the bootstrap circuit can be reduced to less than or equal to half the total capacitance connected to the gate line.

In the case where boosting is started by the bootstrap circuit at the same time as input of the selection signal or in the case where the capacitance of the capacitor included in the bootstrap circuit is not sufficiently larger than the total capacitance connected to the gate line, for example, sufficient boosting might not be performed, or the potential of the gate line might be lowered. Accordingly, with this configuration, the capacitor of the bootstrap circuit cannot be small and the area occupied by the circuit is extremely large, which prevents the device from being smaller.

Further, with the configuration of one embodiment of the present invention, boosting is not performed by the bootstrap circuit in a non-selected state in which a selection signal is not input (when the gate line is in a non-selected state); thus, an increase in power consumption of the buffer circuit in a non-selected state can be suppressed.

Note that the functional circuit includes the selection transistor one of a source and a drain of which is electrically connected to a signal line (source line) to which a potential to be written is input, and a functional element electrically connected to the other of the source and the drain of the selection transistor. The functional element is a circuit having a variety of functions depending on a potential input from the source line through the selection transistor.

Examples of the functional circuit are a pixel in an image display device to which a light-emitting element or a liquid crystal element is applied and a memory cell in a storage device such as a DRAM or an SRAM. A portion of the functional circuit other than the selection transistor corresponds to the functional element. Examples of the functional element are a circuit including a light-emitting element, a storage capacitor, a transistor for controlling current, or the like in an image display device to which a light-emitting element is applied, and a capacitor in a DRAM and a flip-flop circuit in an SRAM in a storage device.

In another embodiment of the present invention, the delay circuit may include an RC circuit.

In another embodiment of the present invention, the delay circuit may include an (n+1)th inverter.

In such a case where an RC circuit including a capacitor and a resistor is used as a delay circuit, the delay circuit can have a simple configuration. Alternatively, in the case where a circuit including an inverter is used as a delay circuit, a resistor is not necessarily used and thus the delay circuit can be formed through the common process with other inverters. Here, current supply capability of the inverter is adjusted by changing the size of the transistors included in the inverter, so that delay time can be freely set.

Another embodiment of the present invention is the semiconductor device in which the bootstrap circuit includes an (n+2)th inverter, a capacitor, and a switch. A delay signal is input to an input terminal of the (n+2)th inverter, and an output terminal of the (n+2) inverter is electrically connected to one terminal of the capacitor. One terminal of the switch is electrically connected to the second signal line, and the other terminal of the switch is electrically connected to the other terminal of the capacitor and the high-potential input terminal of the n-th inverter. In response to the delay signal, the switch is turned off and the first potential is supplied to the other terminal of the capacitor, and then the third potential is output to the high-potential input terminal of the n-th inverter.

With such a configuration of the bootstrap circuit in the buffer circuit, the capacitor can be charged in a non-selection period during which a selection signal is not input. Thus, right after the delay signal is input, the potential of the gate line can be boosted rapidly to a potential higher than the predetermined potential through an inverter which is the closest to the output side among the plurality of inverters included in the buffer circuit.

For example, a configuration in which the bootstrap circuit boosts the potential of an output terminal of the buffer circuit may be employed. In this case, however, it is required to charge at least the capacitor in the bootstrap circuit and gate capacitance of the selection transistor connected to the gate line right after a selection signal is input. Thus, it takes a long time for the potential of the gate line to become stable through gradual rising from a low potential. With the above-described configuration of one embodiment of the present invention, a high potential can be directly input to the gate line, whereby the writing operation can be started in an extremely short time, and thus the drive frequency can be improved.

Another embodiment of the present invention is the semiconductor device which has the above configuration and in which the bootstrap circuit includes the (n+2)th inverter, the capacitor, and a p-channel transistor. A delay signal is input to the input terminal of the (n+2)th inverter and an output terminal of the (n+2)th inverter is electrically connected to the one terminal of the capacitor. A first terminal of the transistor is electrically connected to the second signal line. A second terminal of the transistor is electrically connected to the other electrode of the capacitor and the high-potential input terminal of the n-th inverter. A gate of the transistor is electrically connected to the output terminal of the output terminal of the (n+2)th inverter. In response to the delay signal, the transistor is turned off and the first potential is supplied to the other terminal of the capacitor, and then the third potential is output to the high-potential input terminal of the n-th inverter.

It is preferable to use a p-channel transistor for the switch in the bootstrap circuit as described above. With the use of the p-channel transistor, a decrease in a potential which is input to the high-potential input terminal of the inverter which is the closest to the output side among the plurality of inverters included in the buffer circuit through the switch in advance by the threshold voltage of the switch can be suppressed. Accordingly, boosting efficiency of the bootstrap circuit can be improved.

Another embodiment of the present invention is an image display device including the semiconductor device in which the functional circuit includes a light-emitting element.

Another embodiment of the present invention is an image display device including the semiconductor device in which the functional circuit includes a liquid crystal element.

The above-described buffer circuit can be applied to an image display device to which a light-emitting element such as an organic EL element is applied or a liquid crystal display device to which a liquid crystal element is applied. Thus, an image display device with low power consumption and an increased drive frequency can be provided. Accordingly, an image display device that has a larger number of pixels and is suitable for high-speed display can be provided.

Another embodiment of the present invention is a storage device including the semiconductor device in which the functional circuit includes a storage element.

The above-described buffer circuit can be applied to a storage device including a selection transistor. Accordingly, a storage device that has low power consumption and operates at high speed can be provided. Examples of the storage element are a volatile storage element such as a DRAM or an SRAM and a non-volatile storage element such as a flash memory, a magnetoresistive RAM (MRAM), a phase change RAM (PRAM), a resistance RAM (ReRAM), or a ferroelectric RAM (FeRAM).

Another embodiment of the present invention is an electronic device including a battery and at least one of the image display device and the storage device.

The image display device or the storage device including the buffer circuit is applied to a portable device powered by a battery, whereby the driving period can be extended, which is preferable. The number of power supply circuits or wirings can be reduced, so that the size of the device can be reduced.

One embodiment of the present invention can provide a semiconductor device with reduced power consumption that includes a selection transistor. Further, a semiconductor device in which the number of wirings and terminals for inputting a power supply potential is reduced and which operates at high speed is provided.

BRIEF DESCRIPTION OF THE DRAWINGS

FIGS. 7A and 7B illustrate an example of circuit operation of a semiconductor device according to one embodiment of the present invention.

FIG. 8 illustrates an example of circuit operation of a semiconductor device according to one embodiment of the present invention.

DETAILED DESCRIPTION OF THE INVENTION

Figure 1A:
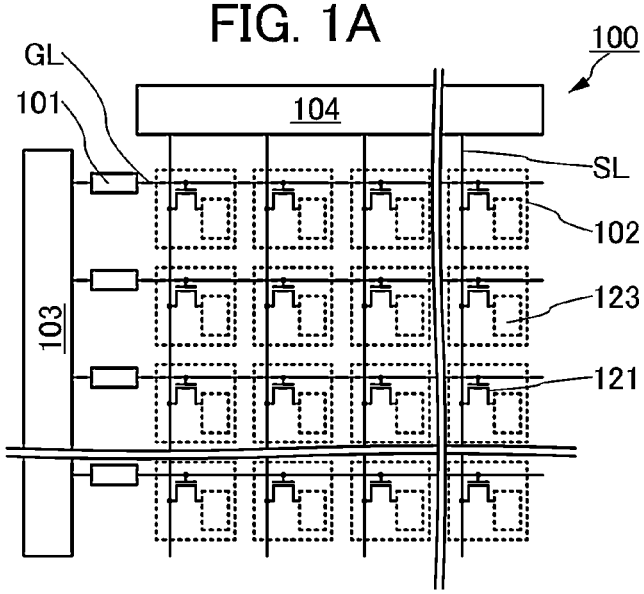
FIGS. 1A and 1B illustrate a configuration example of a semiconductor device according to one embodiment of the present invention.

Embodiments are described in detail with reference to the drawings. Note that the invention is not limited to the following description, and it is easily understood by those skilled in the art that various changes and modifications can be made without departing from the spirit and scope of the invention. Therefore, the invention should not be construed as being limited to the description in the following embodiments. Note that in the configurations of the invention described below, the same portions or portions having similar functions are denoted by the same reference numerals in different drawings, and description of such portions is not repeated.

Note that in each drawing described in this specification, the size, the layer thickness, or the region of each component is exaggerated for clarity in some cases. Therefore, embodiments of the present invention are not limited to such scales.

Note that in this specification and the like, the ordinal number such as "first", "second", or "third" is given for convenience to distinguish elements, and not given to limit the number, the arrangement, and the order of the steps.

A transistor is one of a variety of semiconductor elements, and can amplify current or voltage and perform a switching operation for controlling conduction and non-conduction, for example. A transistor in this specification includes an insulated-gate field effect transistor (IGFET) and a thin film transistor (TFT).

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

In this specification and the like, one of a source and a drain of a transistor is referred to as a "first electrode" or a "first terminal" and the other of the source and the drain is referred to as a "second electrode" or a "second terminal" in some cases. Note that a gate is referred to as a "gate" or a "gate electrode".

Note that in this specification and the like, two electrodes of a diode are referred to as a "first terminal" and a "second terminal" or a "first electrode" and a "second electrode" in some cases. Here, a direction in which current flows from the first electrode to the second electrode is a forward direction of the diode and its opposite direction is an opposite direction of the diode. In addition, one of the electrodes is simply referred to as a "terminal", an "electrode", "one end", "one", or the like in some cases.

In this specification and the like, two terminals of a two-terminal element such as a coil, a resistor, or a capacitor are referred to as a "first terminal" and a "second terminal" or a "first electrode" and a "second electrode" in some cases. In addition, one of the terminals is simply referred to as a "terminal", an "electrode", "one end", "one", or the like in some cases.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric action"

include a switch such as a transistor, a resistor, a coil, a capacitor, and an element with a variety of functions in addition to an electrode and a wiring.

Note that a node in this specification and the like means an element (e.g., a wiring) which enables electric connection between elements included in a circuit. Therefore, a "node to which A is connected" is a wiring that is electrically connected to A and can be regarded as having the same potential as A. Note that even when one or more elements which enable electrical connection (e.g., switches, transistors, capacitors, inductors, resistors, or diodes) are inserted in a portion of the wiring, the wiring can be regarded as the "node to which A is connected" as long as it has the same potential as A.

In this specification and the like, an expression "grounded" means that a ground potential is applied. In addition, a "ground potential" in this specification and the like means a reference potential or a common potential.

Embodiment 1

In this embodiment, a configuration example of an image display device to which a light-emitting element is applied, which is an example of an image display device including a semiconductor device according to one embodiment of the present invention, and an operation example thereof are described with reference to drawings.

[Display Device]

FIG. 1A is a schematic diagram of a display device 100.

The display device 100 includes a plurality of pixels 102 that is arranged in a matrix, a first driver circuit 103, and a second driver circuit 104.

Each of the pixels 102 includes at least a selection transistor 121 and a functional element 123. The functional element 123 is connected to a second terminal of the selection transistor 121 and includes at least a light-emitting element.

Gates of the selection transistors 121 of the plurality of pixels 102 that is positioned adjacent in a row of all the pixels 102 are electrically connected to a gate line GL. Each of a plurality of gate lines GL is electrically connected to a corresponding buffer circuit 101. The buffer circuits 101 are electrically connected to the first driver circuit 103.

Further, first terminals (either sources or drains) of the selection transistors 121 of the plurality of pixels 102 that is positioned adjacent in a column of all the pixels 102 are electrically connected to a source line SL. A plurality of source lines SL is each electrically connected to the second driver circuit 104.

The first driver circuit 103 transmits a selection signal to the plurality of buffer circuits 101. A gate line GL connected to the buffer circuit 101 to which the selection signal is input is selected, whereby the plurality of pixels 102 that is positioned adjacent in a row is selected. Thus, the selection transistors 121 of the pixels 102 are turned on.

The second driver circuit 104 selectively transmits a writing signal to the plurality of source lines SL. Here, in response to the writing signal, writing can be performed on the plurality of pixels 102 that is electrically connected to the gate line GL selected by the first driver circuit 103.

Figure 1B:
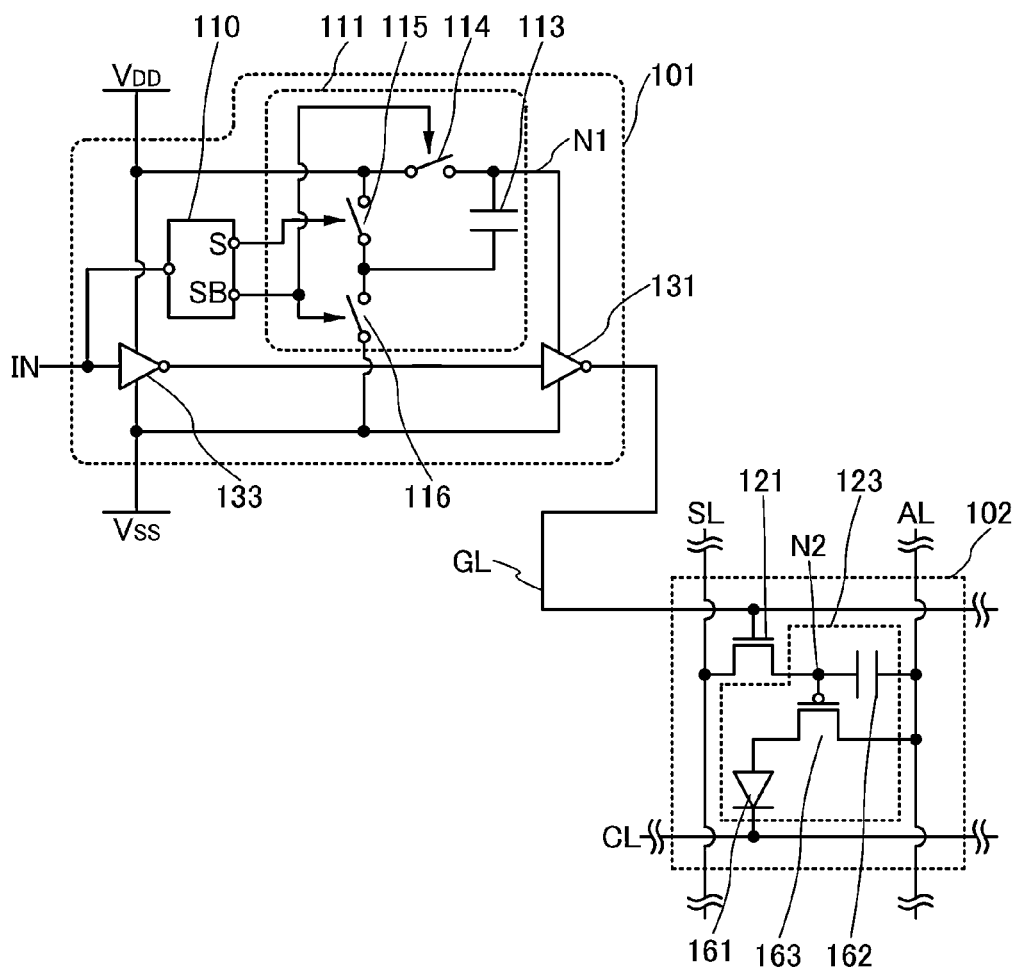

FIG. 1B is a circuit diagram illustrating the buffer circuit 101 and the pixel 102 electrically connected thereto, which are extracted from FIG. 1A.

[Pixel]

The pixel 102 includes the selection transistor 121 and the functional element 123. The functional element 123 includes a light-emitting element 161, a capacitor 162, and a transistor 163. The gate line GL, the source line SL, an anode line AL, and a cathode line CL are electrically connected to the pixel 102.

A gate of the selection transistor 121 is electrically connected to the gate line GL. A first terminal of the selection transistor 121 is electrically connected to the source line SL. A second terminal of the selection transistor 121 is electrically connected to a first terminal of the capacitor 162 and a gate of the transistor 163. A second terminal of the capacitor 162 is electrically connected to the anode line AL. A first terminal of the transistor 163 is electrically connected a first terminal of the light-emitting element 161. A second terminal of the transistor 163 is electrically connected to the anode line AL. A second terminal of the light-emitting element 161 is electrically connected to the cathode line CL.

Here, a node connected to the second terminal of the selection transistor 121, the first terminal of the capacitor 162, and the gate of the transistor 163 is referred to as a node N2.

A potential higher than a potential input to the cathode line CL is input to the anode line AL.

The transistor 163 is a p-channel transistor. The transistor 163 is provided for controlling current flowing in the light-emitting element 161.

The capacitor 162 is provided for holding a potential written in the node N2 through the selection transistor 121. The potential held in the node N2 controls the amount of the current flowing through the transistor 163, so that emission luminance of the light-emitting element 161 is controlled.

The light-emitting element 161 is an element that emits light by application of voltage between a pair of electrodes. A typical example thereof is an organic EL element in which a layer containing a light-emitting organic compound is interposed between a pair of electrodes. Further, a variety of light-emitting elements such as an LED element and an inorganic EL element in which a layer containing a light-emitting inorganic compound is interposed between a pair of electrodes can be used.

In this embodiment, the pixel 102 has a configuration combining two transistors, one capacitor, and one light-emitting element; however the pixel 102 can employ not only this configuration but also various configurations. For example, a correction circuit for variation in electrical characteristics of a transistor may be provided. Further, as the transistor 163, a p-channel transistor is used in the above configuration; however, an n-channel transistor, which is similar to the selection transistor 121, may be used.

The above is the description of the configuration of the pixel 102.

[Buffer Circuit]

A high power supply potential VDD and a low power supply potential VSS are input to the buffer circuit 101. A selection signal IN which is output from the first driver circuit 103 is input to an input side of the buffer circuit 101. The gate line GL is electrically connected to an output side of the buffer circuit 101.

Depending on the selection signal IN, the buffer circuit 101 can generate a potential higher than the high power supply potential VDD and is output the potential to the gate line GL.

The buffer circuit 101 includes at least two inverters that are connected in series (an inverter 131 and an inverter 133), a delay circuit 110, and a bootstrap circuit 111.

The selection signal IN is input to an input terminal of the inverter 133. The high power supply potential VDD is input to a high-potential input terminal of the inverter 133. The low power supply potential VSS is input to a low-potential input terminal of the inverter 133. An output terminal of the inverter 133 is electrically connected to an input terminal of the inverter 131.

An output terminal of the inverter 131 is electrically connected to the gate line GL. A high-potential input terminal of the inverter 131 is electrically connected to the bootstrap circuit 111. The low power supply potential VSS is input to a low-potential input terminal of the inverter 131.

The selection signal IN is input to the delay circuit 110. Depending on the selection signal IN, a delay signal S (or the delay signal S and an inverted delay signal SB), which is delayed compared to the selection signal IN, is generated by the delay circuit 110 and output to the bootstrap circuit 111 by the delay circuit 110.

The delay signal S (or the delay signal S and the inverted delay signal SB), the high power supply potential VDD, and the low power supply potential VSS are input to the bootstrap circuit 111.

In response to the delay signal S (or the delay signal S and the inverted delay signal SB) input from the delay circuit 110, the bootstrap circuit 111 outputs a potential higher than the high power supply potential VDD to a node (node N1) connected to the high-potential input terminal of the inverter 131.

FIG. 1B illustrates a configuration example of the bootstrap circuit 111. The configuration illustrated in FIG. 1B includes a capacitor 113 and three switches (a switch 114, a switch 115, and a switch 116).

The high power supply potential VDD is input to a first terminal of the switch 114. A second terminal of the switch 114 is electrically connected to a first terminal of the capacitor 113 and the high-potential input terminal of the inverter 131. The high power supply potential VDD is input to a first terminal of the switch 115. A second terminal of the switch 115 is electrically connected to a second terminal of the capacitor 113 and a first terminal of the switch 116. The low power supply potential VSS is input to a second terminal of the switch 116.

At this time, the operation of the switch 115 is controlled by the delay signal S generated in the delay circuit 110, and the operation of the switches 114 and 116 is controlled by the inverted delay signal SB whose phase is inverted with respect to that of the delay signal S.

When the buffer circuit 101 is not selected by the selection signal IN, the switch 115 is controlled to be off and the switches 114 and 116 are controlled to be on. At this time, the high power supply potential VDD is supplied to the first terminal of the capacitor 113 and the low power supply potential VSS is supplied to the second terminal of the capacitor 113, and thus the capacitor 113 is charged.

When the state of the buffer circuit 101 is changed from the non-selected state to be selected by the selection signal IN, the high power supply potential VDD (or a predetermined potential close to the high power supply potential VDD) is supplied to the gate line GL through the inverters 133 and 131. Then, after the potential of the gate line GL becomes stable, the delay signal S and the inverted delay signal SB are output from the delay circuit 110. In response to the delay signal S and the inverted delay signal SB, the switch 115 is turned on and the switches 114 and 116 are turned off. Thus, a potential corresponding to the high power supply potential VDD is input to the second terminal of the capacitor 113 through the switch 115, whereby the potential of the node N1 input to the high-potential input terminal of the inverter 131 is increased. As a result, the potential of the gate line GL electrically connected to the output terminal of the inverter 131 is increased.

In such a manner, the buffer circuit 101 can output a potential higher than the high power supply potential VDD to the gate line GL.

As described above, the high power supply potential VDD is supplied to the gate line and then the bootstrap circuit 111 boosts the potential; accordingly, boosting can be performed efficiently and the size of the capacitor 113 included in the bootstrap circuit 111 can be reduced. For example, the capacitance of the capacitor 113 can be reduced to less than or equal to half the total capacitance connected to the gate line GL.

In the case where boosting is started by the bootstrap circuit at the same time as input of the selection signal IN or in the case where the capacitance of the capacitor included in the bootstrap circuit is not sufficiently larger than the total capacitance connected to the gate line, for example, sufficient boosting might not be performed, or the potential of the gate line might be lowered. Accordingly, with this configuration, the capacitor of the bootstrap circuit cannot be small and the area occupied by the circuit is extremely large, which prevents the device from being smaller.

With the buffer circuit 101 having the configuration of one embodiment of the present invention, boosting is not performed by the bootstrap circuit 111 in a non-selected state; thus, an increase in power consumption of the buffer circuit 101 in a non-selected state can be suppressed.

Since two signals (i.e., the delay signal S and the inverted delay signal SB) are required in the bootstrap circuit 111 having the above configuration, the delay circuit 110 is configured to generate the delay signal S and the inverted delay signal SB; however, in the case of a configuration in which the bootstrap circuit 111 can be operated only by the delay signal S, the delay circuit 110 may output only the delay signal S. The delay circuit 110 can have various configurations depending on the configuration of the bootstrap circuit 111 connected to the delay circuit 110.

More specific configuration and operation examples of the buffer circuit 101 are described in detail later.

The above is the description of the buffer circuit 101 illustrated in FIG. 1B.

A configuration in which the buffer circuit 101 includes two inverters that are connected in series, the delay circuit 110, and the bootstrap circuit 111 is illustrated in FIG. 1B; however, three or more inverters may be connected in series.

Figure 2:
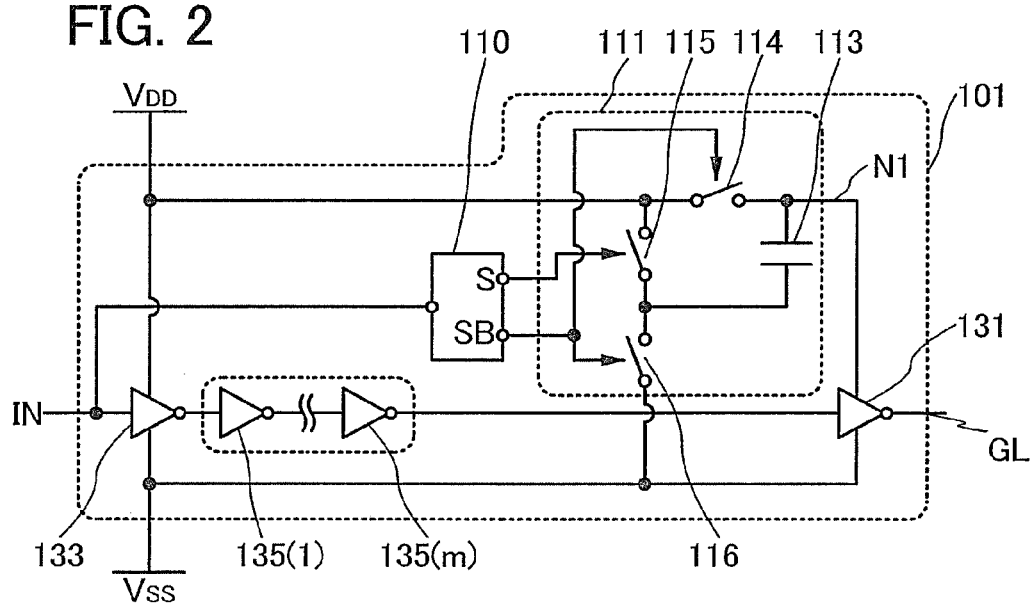
FIG. 2 illustrates a configuration example of a semiconductor device according to one embodiment of the present invention.

FIG. 2 illustrates a configuration in which m inverters (an inverter 135(1) to an inverter 135(m)) are connected in series between the inverter 133 and the inverter 131. Here, the number of m inverters that are connected in series is preferably even.

Further, the current supply capability of the plurality of inverters that is connected in series is preferably increased gradually from an input side to an output side, that is, from the inverter 133 toward the inverter 131.

[Configuration Example of Buffer Circuit]

More specific configuration examples of the buffer circuit 101 are described below with reference to drawings.

Configuration Example 1

Figure 3A:
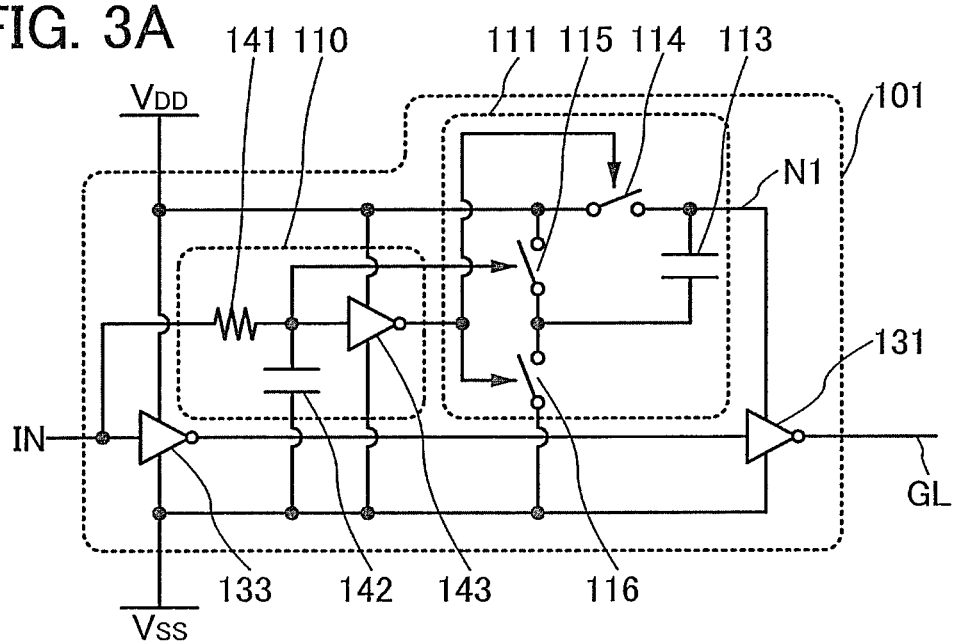
FIGS. 3A and 3B each illustrate a configuration example of a semiconductor device according to one embodiment of the present invention.

FIG. 3A illustrates a configuration example of the buffer circuit 101 in which an RC circuit is used as the delay circuit 110. Note that the configuration of the buffer circuit 101 in FIG. 3A is the same as that in FIG. 1B except for the configuration of the delay circuit 110.

The delay circuit 110 illustrated in FIG. 3A includes a resistor 141, a capacitor 142, and an inverter 143. The selection signal IN is input to a first terminal of the resistor 141, and a second terminal of the resistor 141 is electrically connected to a first terminal of the capacitor 142 and an input terminal of the inverter 143. Further, a low power supply potential VSS is input to a second terminal of the capacitor 142.

When the state of the buffer circuit 101 is changed to be selected by the selection signal IN input to the delay circuit 110, the potential of a node connected to the first terminal of the capacitor 142 is gradually changed. Accordingly, the potential of the node is input to the switch 115 in the bootstrap circuit 111 as the delay signal S, which is delayed compared to the selection signal IN. A signal obtained by inverting the potential of the node by the inverter 143 is input to the switches 114 and 116 in the bootstrap circuit 111 as the inverted delay signal SB.

Since two signals (i.e., the delay signal S and the inverted delay signal SB) are required in the bootstrap circuit 111 having the above configuration, the inverter 143 for generating the inverted delay signal SB is provided. Thus, in the case of a configuration in which the bootstrap circuit 111 can be operated only by the delay signal S, the inverter 143 is not necessarily provided.

In such a case where an RC circuit is used, the delay circuit 110 can have a simple configuration.

Configuration Example 2

Figure 3B:
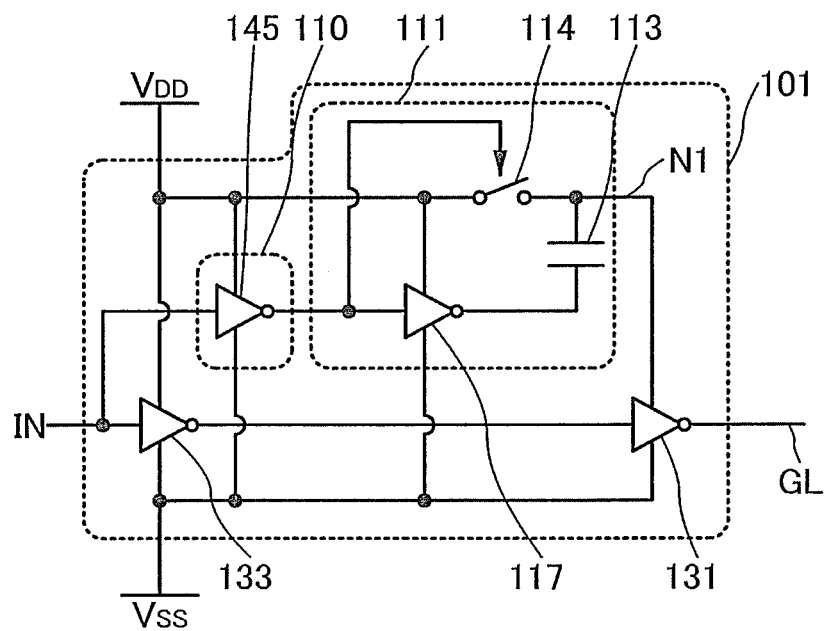

FIG. 3B illustrates a configuration example of the buffer circuit 101 in which an inverter 145 for delay is applied to the delay circuit 110 and the bootstrap circuit 111 has a different configuration. Note that the configuration of the buffer circuit 101 in FIG. 3B is the same as that in FIG. 1B except for the configurations of the delay circuit 110 and the bootstrap circuit 111.

In the bootstrap circuit 111 in FIG. 3B, the switch 115 and the switch 116 which are illustrated in FIG. 1B are replaced with one inverter 117. The delay signal S which is output from the delay circuit 110 is input to an input terminal of the inverter 117, and an output terminal of the inverter 117 is electrically connected to the second terminal of the capacitor 113. Further, the switch 114 is controlled by the delay signal S.

After the selection signal IN is input to the buffer circuit 101 and then the potential of the gate line GL is stabilized at a potential corresponding to the high power supply potential VDD, the inverter 145 used for the delay circuit 110 outputs the delay signal S. Thus, current supply capability of the inverter 145 may be determined in consideration of current supply capability of the inverters 133 and 131, a time for charging the gate line GL which depends the total capacitance applied to the gate line GL, a time for inverting the state of the switch 114 in the bootstrap circuit 111, or the like. For example, the inverter 145 which has current supply capability inferior to at least that of the inverters 133 and 131 is used.

In other words, the current supply capability of the inverter 145 may be determined so that a period between a time when the selection signal IN is input and a time when the output of the inverter 117 is inverted becomes longer than a period between a time when the selection signal IN is input and a time when the potential of the gate line GL is stabilized at a potential corresponding to the high power supply potential VDD.

In order to make the delay time longer, a capacitor may be provided in parallel to a node electrically connected to an output terminal of the inverter 145 in the delay circuit 110. Alternatively, a resistor may be provided in series with the node. By increasing capacitance or resistance component at the node between the delay circuit 110 and the bootstrap circuit 111, the delay time can be increased.

When the buffer circuit 101 is in a non-selected state, the switch 114 is controlled to be on depending on an output potential of the inverter 145 and a potential corresponding to the low power supply potential VSS is input to the second terminal of the capacitor 113 through the inverter 117.

By the delay signal S which is output from the inverter 145 depending on the selection signal IN input to the buffer circuit 101, the switch 114 is brought into an off state and a potential corresponding to the high power supply potential VDD is supplied to the node connected to the second terminal of the capacitor 113 through the inverter 117. Accordingly, the potential of the node N1 electrically connected to the high-potential input terminal of the inverter 131 is increased to a potential higher than the high power supply potential VDD.

In the case where the inverter 145 is used for the delay circuit 110, a resistor, a capacitor, or the like is not necessarily used and thus the delay circuit can be manufactured through the common process with another inverter. By adjusting current supply capability of the inverter as appropriate, the delay time can be optimum.

Configuration Example 3

In this configuration example, an example which has the same configuration as that of the buffer circuit 101 in Configuration Example 2 except the inverters and the switches are replaced with transistors is described.

Figure 4A:
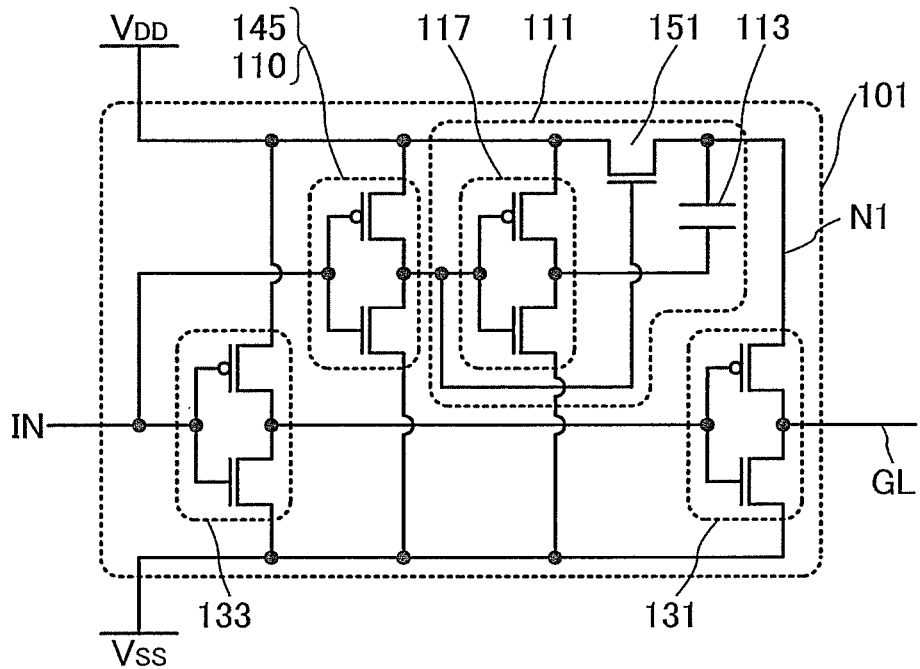
FIGS. 4A and 4B each illustrate a configuration example of a semiconductor device according to one embodiment of the present invention.

In the buffer circuit 101 in FIG. 4A, the inverters 133, 131, 145, and 117 in FIG. 3B are replaced with CMOS inverter circuits. Further, an n-channel transistor 151 is used for the switch 114.

The high power supply potential VDD is input to a first terminal of the transistor 151. A second terminal of the transistor 151 is electrically connected to the first terminal of the capacitor 113 and the high-potential input terminal of the inverter 131. A gate of the transistor 151 is electrically connected to a node between the inverter 145 and the inverter 117.

With such a configuration, inverters and switches included in the buffer circuit 101 can be manufactured through the same process; thus, the manufacturing process can be simplified.

Configuration Example 4

In this configuration example, an example which has the same configuration as that of the buffer circuit 101 in Configuration Example 2 except the inverters and the switches are replaced with transistors and which is different from Configuration Example 3 is described.

Figure 4B:
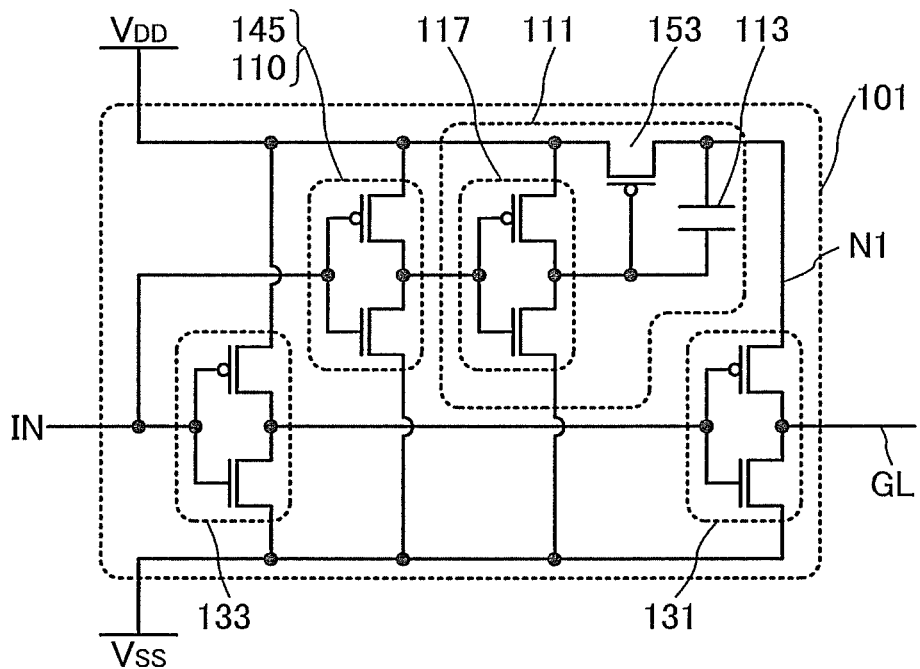

In the buffer circuit 101 in FIG. 4B, the transistor 151 in FIG. 4A is replaced with a p-channel transistor 153.

The high power supply potential VDD is input to a first terminal of the transistor 153. A second terminal of the transistor 153 is electrically connected to the first terminal of the capacitor 113 and the high-potential input terminal of the inverter 131. A gate of the transistor 153 is electrically connected to the output terminal of the inverter 117 and the second terminal of the capacitor 113.

The p-channel transistor 153 is used for the switch 114 in the bootstrap circuit 111 as described above, so that a decrease in a potential input through the transistor 153 to the high-potential input terminal of the inverter 131, which is the closest to the output side among the plurality of inverters included in the buffer circuit 101, by the threshold voltage of the transistor 153 can be suppressed. Thus, a potential very close to the high power supply potential VDD can be supplied to the gate line GL through the transistor 153 and the inverter 131 right after the delay signal IN is input. Accordingly, boosting efficiency of the bootstrap circuit 111 can be improved.

Modification Example

In Configuration Example 3 and Configuration Example 4, CMOS inverter circuits are used as inverter circuits; however, the inverter circuits can be composed of only n-channel transistors.

Figure 5A:
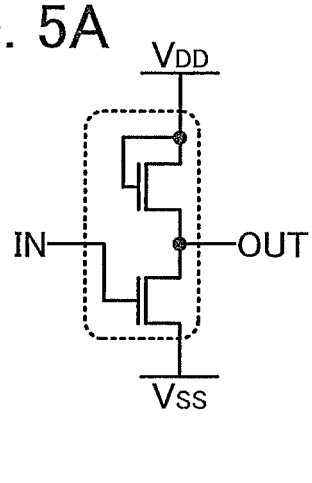
FIGS. 5A and 5B each illustrate a configuration example of a semiconductor device according to one embodiment of the present invention.
Figure 5B:
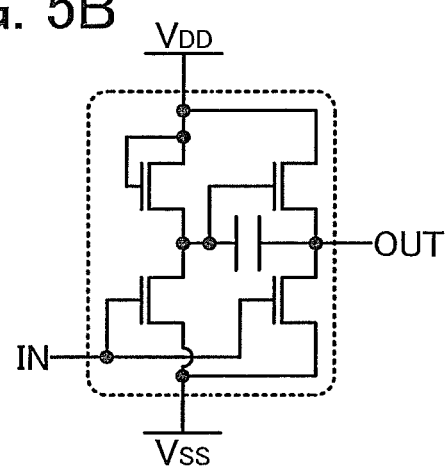

FIGS. 5A and 5B each illustrate a configuration example of an inverter in which only n-channel transistors are used.

FIG. 5A illustrates an inverter including two n-channel transistors. With the inverter including such a few elements, the configuration of the buffer circuit 101 can be simpler, which is preferable.

FIG. 5B illustrates an inverter including four n-channel transistors and one capacitor. With the inverter having such a configuration, the output potential can be stable, which is preferable.

By forming the buffer circuit 101 using only transistors having the same conductivity type in the above-described manner, the manufacturing process can be simpler, which is preferable. For example, in an image display device to which a transistor including an oxide semiconductor as a semiconductor layer is applied, it is preferable to form the pixel 102 and the buffer circuit simultaneously on the same substrate.

The above is the description of configuration examples of the buffer circuit 101.

[Example of Circuit Operation]

A more specific operation example of the buffer circuit 101 described in Configuration Example 4 is described below with reference to a timing chart.

Figure 6A:
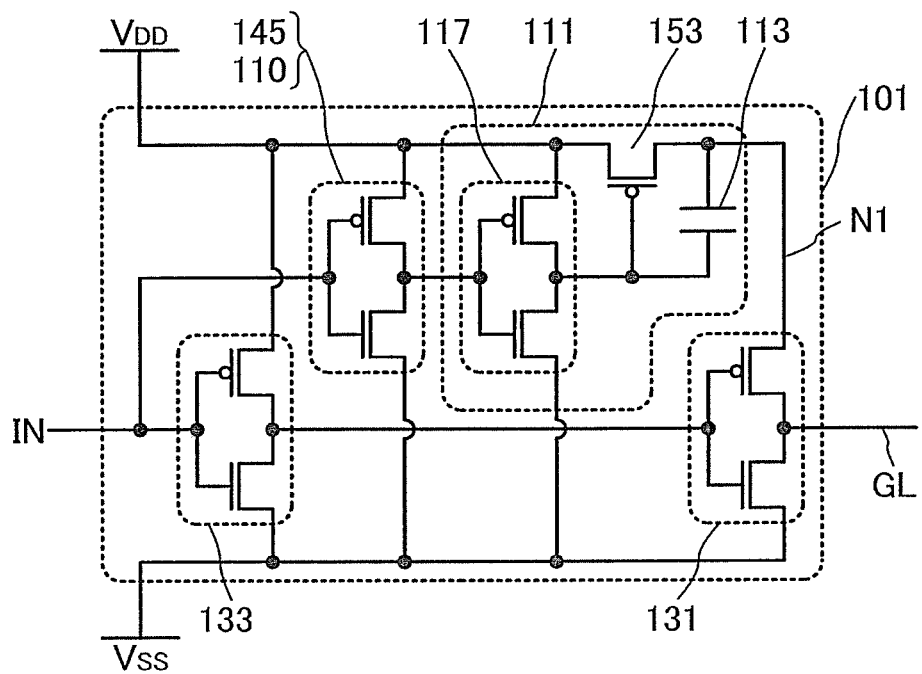
FIGS. 6A and 6B illustrate an example of circuit operation of a semiconductor device according to one embodiment of the present invention.
Figure 6B:
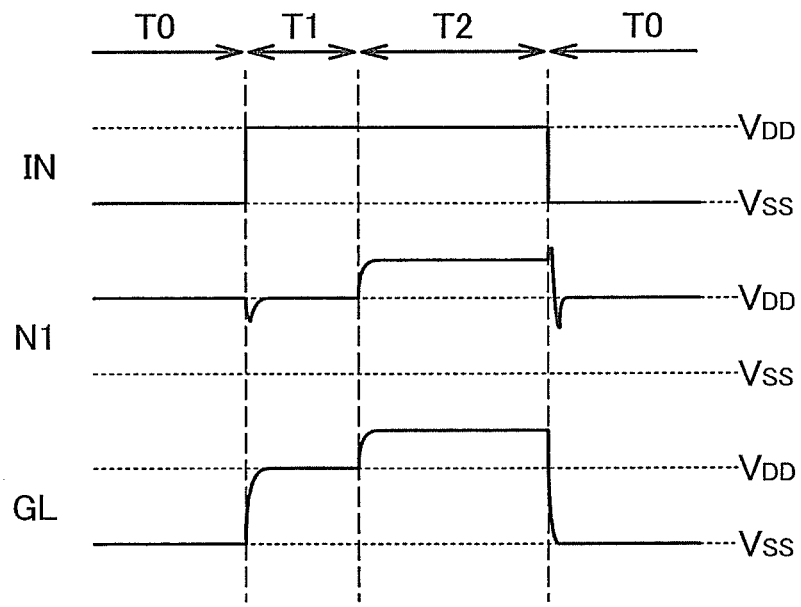

FIG. 6A illustrates the configuration of the buffer circuit 101 described in Configuration Example 4. FIG. 6B is a timing chart showing a potential change over time of the selection signal IN, the node N1, and the gate line GL in FIG. 6A.

In a period T0 during which the gate line GL is in a non-selected state, shown in FIG. 6B, a low-level potential is input as the selection signal IN. In a period T2 during which the gate line GL is in a selected state, a high-level potential is input as the selection signal IN and a potential which is boosted by the bootstrap circuit 111 is output to the gate line GL. A period T1 between the non-selection period (period T0) and the selection period (period T2) is a delay period after the high-level potential is input as the selection signal IN until the bootstrap circuit 111 starts to operate.

First, an operation of the buffer circuit 101 in the period T0 during which the gate line GL is in a non-selected state is described with reference to FIG. 6B and FIG. 7A.

In the period T0, the low-level potential is input to the inverter 133 and the inverter 145 as the selection signal IN. Accordingly, the low-level potential is input to the gate line GL through the inverter 131 which is connected to the inverter 133 in series.

The low-level potential is output from the inverter 117 connected to the inverter 145 in series, so that the low-level potential is input to the second terminal of the capacitor 113 and the gate of the transistor 153. Accordingly, the transistor 153 is turned on, and the potential of the node N1 connected to the high-potential input terminal of the inverter 131 through the transistor 153 becomes a potential close to the high power supply potential VDD. At this time, the capacitor 113 is kept charged in response to the potential difference between the two terminals of the capacitor 113.

Next, operation in the period T1, which is the delay period right after the high-level potential is input as the selection signal IN, is described with reference to FIG. 6B and FIG. 7B.

First, the high-level potential is input as the selection signal IN. By this, the output potentials of the inverters 133 and 131 are inverted.

At this time, the bootstrap circuit 111 is kept from operating by the inverter 145 for delay. That is, in the delay period, the potential of the output terminal of the inverter 145 does not reach a potential high enough to make the output potential of the inverter 117 inverted, and thus the output potential of the inverter 117 is kept at the high-level potential as in the period T0. Following the period T0, in the period T1, the transistor 153 is kept on, and thus the high power supply potential VDD is output to the gate line GL through the inverter 131.

In such a manner, in the period T1, which is the delay period, the potential of the gate line GL is changed from the low-level potential to a potential close to the high power supply potential VDD.

Next, operation in the selection period T2 after the delay period is described with reference to FIG. 6B and FIG. 8.

When the selection period T2 starts, the output potential of the inverter 117 is inverted, and a potential corresponding to the high power supply potential VDD is input to the gate of the transistor 153 and the second terminal of the capacitor 113. Thus, the transistor 153 is turned off, and with an increase in potential of the second terminal of the capacitor 113, the potential of the node N1 is increased.

In such a manner, the potential of the gate line GL is boosted to a potential higher than the high power supply potential VDD through the inverter 131.

In the selection period T2, a potential sufficiently higher than the high power supply potential VDD is supplied to the gate of the selection transistor 121 in the pixel 102 which is connected to the gate line GL. Accordingly, an on-state resistance of the selection transistor 121 can be sufficiently reduced, and the predetermined potential can be written to the functional element 123 through the selection transistor 121 at high speed.

Even in a case where the high power supply potential VDD is used for writing, a decrease in the written potential by the threshold voltage of the selection transistor 121 can be suppressed, and thus a power supply circuit for generating a potential used for writing, a wiring for supplying a potential from the power supply circuit, or the like does not have to be additionally provided. That is, with the buffer circuit 101, reduction in power consumption or size of an electronic device can be easily achieved.

Then, the selection period T2 ends and the non-selection period T0 starts again, and at that time, the low-level potential is input as the selection signal IN.

Since the inverter 145 for delay is provided, the outputs of the inverters 133 and 131 are inverted before the bootstrap circuit 111 stops its operation, and the low power supply potential VSS is supplied to the gate line GL.

After that, the output of the inverter 145 is inverted, whereby a potential corresponding to the low power supply potential VSS is supplied to the gate of the transistor 153 and the second terminal of the capacitor 113 through the inverter 117. Accordingly, the transistor 153 is turned on, whereby charging of a potential corresponding to the potential difference between the two terminals of the capacitor 113 starts, and the potential of the node N1 is stabilized at the high power supply potential VDD.

The above is the description of the example of the circuit operation of the buffer circuit 101.

In the display device 100 with the buffer circuit 101 having such a structure, an additional power supply circuit for generating a power supply potential to turn on the selection transistor surely does not have to be provided, and power consumption can be reduced. Further, without increasing the power supply potential for input to the gate of the selection transistor, the pixel can be performed at high speed.

Modification Example

The display device including a light-emitting element is described above as an example of the display device 100; however, this embodiment can also be applied to a display device including a liquid crystal element. An example of the configuration of the pixel 102 which can be applied to a display device including a liquid crystal element is illustrated in FIG. 9.

Figure 9:
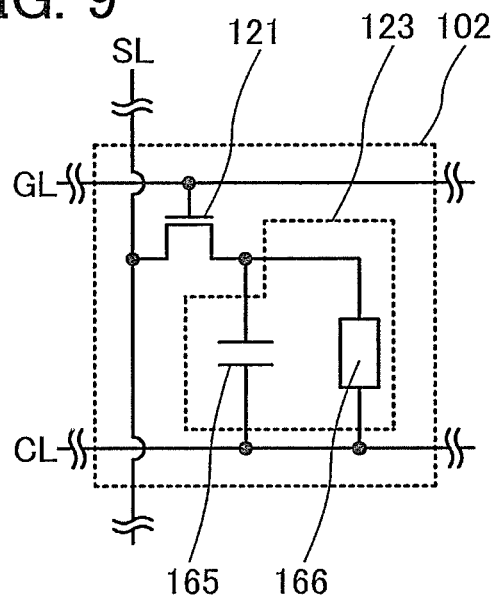
FIG. 9 illustrates a configuration example of a pixel according to one embodiment of the present invention.

The pixel 102 illustrated in FIG. 9 includes the selection transistor 121, a capacitor 165, and a liquid crystal element 166. Further, a gate line GL, a source line SL, and a cathode line CL are electrically connected to the pixel 102. Note that here, the configuration including the capacitor 165 and the liquid crystal element 166 corresponds to the functional element 123.

A second terminal of the selection transistor 121 is electrically connected to a first terminal of the capacitor 165 and a first terminal of the liquid crystal element 166. A second terminal of the capacitor 165 and a second terminal of the liquid crystal element 166 are electrically connected to the cathode line CL.

The liquid crystal element 166 is an element in which a liquid crystal material is interposed between a pair of electrodes.

In such a pixel 102 to which the liquid crystal element 166 is applied, as well as the above, a predetermined potential is written from the source line SL to the first terminal of the liquid crystal element 166 in a period during which the selection transistor 121 is in an on state; thus display can be performed at a predetermined gray scale level.

Also in the case where an electrophoretic element, a twisting ball, or the like is used instead of the liquid crystal element 166, a configuration similar to that of the pixel 102 can be employed.

That is the description of the display device including a liquid crystal element.

This embodiment can be combined with any of the other embodiments described in this specification as appropriate.

Embodiment 2

One embodiment of the present invention can be applied to a variety of storage devices such as a DRAM or an SRAM. In this embodiment, a configuration example of a storage device that is one embodiment of the present invention is described with reference to drawings.

In a storage device according to one embodiment of the present invention, the pixel including a selection transistor described in Embodiment 1 is replaced with a memory cell including a storage element for storing data. A configuration of a memory cell that can be applied to a storage device according to one embodiment of the present invention is described below.

Although some components (such as a wiring) in a display device are generally called differently from ones having the same function in a storage device, common names are used for them here, following the names used in Embodiment 1.

Configuration Example 1

In this configuration example, a storage device including a DRAM element is described.

Figure 10A:
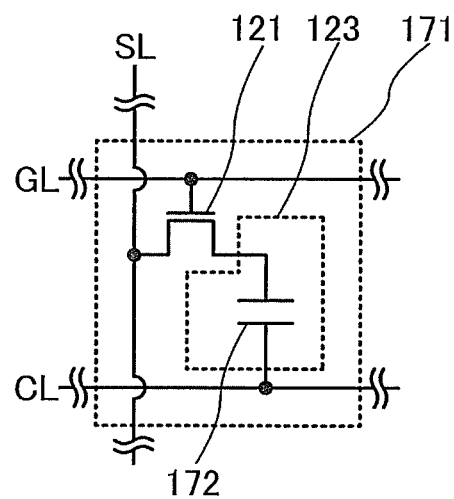
FIGS. 10A and 10B each illustrate a configuration example of a memory cell according to one embodiment of the present invention.

FIG. 10A illustrates a memory cell 171 to which a DRAM element is applied. The memory cell 171 includes the selection transistor 121 and a capacitor 172. Here, the configuration including the capacitor 172 corresponds to the functional element 123.

A second terminal of the selection transistor 121 is electrically connected to a first terminal of the capacitor 172. A second terminal of the capacitor 172 is electrically connected to a cathode line CL.

The memory cell 171 can store data by holding a potential written to the first terminal of the capacitor 172 through the selection transistor 121.

The data stored in the memory cell 171 can be read by detecting a potential change of a source line SL at the time of turning on the selection transistor 121 with a sense amplifier or the like. Note that the data held in the memory cell 171 is lost in reading in the case of a DRAM; thus, it is preferable that the data be written again to the same or another memory cell right after the reading operation.

In the selection transistor 121, a single crystal semiconductor, a polycrystalline semiconductor, a microcrystalline semiconductor, or an amorphous semiconductor can be used as a semiconductor in which a channel is formed. The semiconductor in which a channel is formed may be formed by stacking more than two of these semiconductors. Examples of a semiconductor material are silicon, germanium, silicon germanium, silicon carbide, and gallium arsenide. A transistor including such a semiconductor material can operate at sufficiently high speed; thus, reading of stored data can be performed at high speed, for example. In other words, high-speed operation of the semiconductor device can be obtained.

With such a configuration, the number of wirings can be reduced, so that a circuit configuration can be simpler. In addition, the memory cell includes one transistor and one capacitor, and thus can be reduced in size.

In the selection transistor 121, an oxide semiconductor can be used as a semiconductor in which a channel is formed. An oxide semiconductor has an energy gap that is as wide as 3.0 eV or more and thus in a transistor obtained by processing an oxide semiconductor under appropriate conditions, a leakage current between the source and the drain in an off state (off-state current) can be extremely low. Thus, a semiconductor device with low power consumption can be provided.

An oxide semiconductor to be used preferably includes at least indium (In) or zinc (Zn). In particular, In and Zn are preferably contained. As a stabilizer for reducing variation in electrical characteristics of a transistor using the oxide semiconductor, gallium (Ga) is preferably additionally contained. Tin (Sn) is preferably contained as a stabilizer. In addition, as a stabilizer, one or more selected from hafnium (Hf), zirconium (Zr), titanium (Ti), scandium (Sc), yttrium (Y), and a lanthanoid element (such as cerium (Ce), neodymium (Nd), or gadolinium (Gd), for example) is preferably contained.

Preferably, a CAAC-OS (c-axis aligned crystalline oxide semiconductor) film is used as the oxide semiconductor film.

Note that in most cases, the crystal part included in the CAAC-OS film fits inside a cube whose one side is less than 100 nm. From an observation image obtained with a transmission electron microscope (TEM), a boundary between crystal parts in the CAAC-OS film is not clear in some cases. Further, with the TEM, a grain boundary in the CAAC-OS film is not found. Thus, in the CAAC-OS film, a reduction in electron mobility, due to the grain boundary, is suppressed.

Since a clear boundary does not exist, segregation of an impurity and high density of defect states are unlikely to occur.

For example, a CAAC-OS film includes a plurality of crystal parts. In the plurality of crystal parts, c-axes are aligned in a direction parallel to a normal vector of a surface where the CAAC-OS film is formed or a normal vector of a surface of the CAAC-OS film in some cases. When the CAAC-OS film is analyzed by an out-of-plane method with an X-ray diffraction (XRD) apparatus, a peak at 2θ of around 31 degrees which shows alignment appears in some cases. Further, for example, spots (luminescent spots) are observed in an electron diffraction image of the CAAC-film in some cases. An electron diffraction image obtained with an electron beam having a beam diameter of 10 nmϕ or smaller, or 5 nmϕ or smaller, is called a nanobeam electron diffraction image. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 80° to 100°, preferably from 85° to 95°. In addition, a simple term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

Further, the CAAC-OS film can be formed by reducing the density of defect states for example. In an oxide semiconductor, for example, oxygen vacancies cause an increase in the density of defect states. The oxygen vacancies serve as carrier traps or serve as carrier generation sources when hydrogen is captured therein. In order to form the CAAC-OS film, for example, it is important to prevent oxygen vacancies from being generated in the oxide semiconductor. Thus, the CAAC-OS film is an oxide semiconductor film having a low density of defect states. In other words, the CAAC-OS film is an oxide semiconductor film having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has few carrier traps in some cases. Thus, the transistor including the oxide semiconductor in the channel formation region has a small variation in electrical characteristics and high reliability in some cases. A charge trapped by the carrier traps in the oxide semiconductor takes a long time to be released. The trapped charge may behave like a fixed charge. Thus, the transistor which includes the oxide semiconductor having a high density of defect states in the channel formation region has unstable electrical characteristics in some cases.

There are three methods for forming a CAAC-OS film when the CAAC-OS film is used as the oxide semiconductor film.

The first method is to form an oxide semiconductor film at a temperature higher than or equal to 200° C. and lower than or equal to 450° C. to form, in the oxide semiconductor film, crystal portions in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C., to form, in the oxide semiconductor film, crystal parts in which the c-axes are aligned in the direction parallel to a normal vector of a surface where the oxide semiconductor film is formed or a normal vector of a surface of the oxide semiconductor film.

The third method is to form a first oxide semiconductor film with a small thickness, then heat it at a temperature higher than or equal to 200° C. and lower than or equal to 700° C., and form a second oxide semiconductor film, to form, in the oxide semiconductor film, crystal parts in which the c-axes are aligned in the direction parallel to a normal vector of a surface where the oxide semiconductor film is formed or a normal vector of a surface of the oxide semiconductor film.

With the use of the CAAC-OS film in a transistor, change in electrical characteristics of the transistor due to irradiation with visible light or ultraviolet light is small.

After formation of the oxide semiconductor film, it is preferable that dehydration treatment (dehydrogenation treatment) be performed to remove hydrogen or moisture from the oxide semiconductor film so that the oxide semiconductor film is highly purified to contain impurities as little as possible, and that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment.

In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an electrically i-type (intrinsic) or substantially i-type oxide semiconductor film. The oxide semiconductor film formed in such a manner includes extremely few (close to zero) carriers derived from a donor, and the carrier concentration thereof is lower than $1\times10^{14}/cm^3$, preferably lower than $1\times10^{12}/cm^3$, further preferably lower than $1\times10^{11}/cm^3$, still further preferably lower than $1.45\times10^{10}/cm^3$.

The transistor including the oxide semiconductor layer that is highly purified by sufficiently reducing the hydrogen concentration, and in which defect levels in the energy gap due to oxygen vacancies are reduced by sufficiently supplying oxygen can achieve excellent off-state current characteristics. For example, the off-state current (per unit channel width (1 µm) here) at room temperature (25° C.) is 100 zA (1 zA (zeptoampere) is $1\times10^{-21}$ A) or less, preferably 10 zA or less. The off-state current at 85° C. is 100 zA or less, preferably 10 zA or less. In this manner, the transistor that has extremely favorable off-state current characteristics can be obtained with the use of an i-type (intrinsic) or substantially i-type oxide semiconductor layer.

Since the transistor including an oxide semiconductor has an extremely low off-state current, the potential of the capacitor 172 can be held for an extremely long time by turning off the selection transistor 121. Therefore, a refresh operation is not necessary or the interval between refresh operations can be much longer than conventional DRAM.

Note that the oxide semiconductor may include polycrystal, for example. Note that an oxide semiconductor including polycrystal is referred to as a polycrystalline oxide semiconductor. A polycrystalline oxide semiconductor includes a plurality of crystal grains. A polycrystalline oxide semiconductor includes, for example, amorphous parts in some cases.

The oxide semiconductor may include microcrystal. Note that an oxide semiconductor including microcrystal is referred to as a microcrystalline oxide semiconductor. A microcrystalline oxide semiconductor is not absolutely amorphous.

The oxide semiconductor may include an amorphous part. Note that an oxide semiconductor including an amorphous part is referred to as an amorphous oxide semiconductor. An amorphous oxide semiconductor, for example, has disordered atomic arrangement and no crystal part. An amorphous oxide semiconductor, for example, does not have a specific shape as in quartz and regularity in atomic arrangement.

Note that the oxide semiconductor film may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

That is the description of the storage device including a DRAM element.

Configuration Example 2

In this configuration example, a storage device including an SRAM element is described.

Figure 10B:
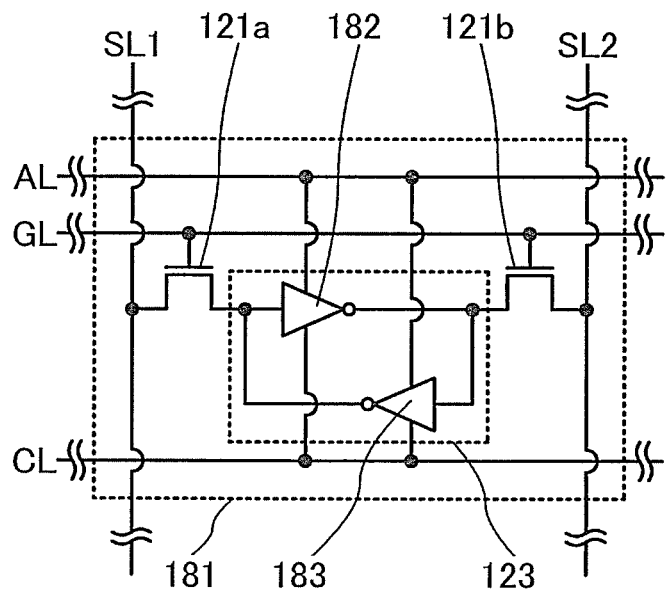

FIG. 10B illustrates a memory cell 181 to which an SRAM element is applied. The memory cell 181 includes two selection transistors (a selection transistor 121*a* and a selection transistor 121*b*) and two inverters (an inverter 182 and an inverter 183). The memory cell 181 is electrically connected to a gate line GL, two source lines (a source line SL1 and a source line SL2), an anode line AL, and a cathode line CL. The configuration including the two inverters corresponds to the functional element 123.

A gate of the selection transistor 121*a* is electrically connected to the gate line GL. A first terminal of the selection transistor 121*a* is electrically connected to the source line SL1. A second terminal of the selection transistor 121*a* is electrically connected to an input terminal of the inverter 182 and an output terminal of the inverter 183. A second terminal of the selection transistor 121*b* is electrically connected to the source line SL2. A first terminal of the selection transistor 121*b* is electrically connected to an output terminal of the inverter 182 and an input terminal of the inverter 183. High-potential input terminals of the inverter 182 and the inverter 183 are electrically connected to the anode line AL. Low-potential input terminals of the inverter 182 and the inverter 183 are electrically connected to the cathode line CL. The output terminal of the inverter 182 is connected to the input terminal of the inverter 183, and the input terminal of the inverter 182 is connected to the output terminal of the inverter 183 so as to form an inverter loop.

Data is written to the memory cell 181 by inputting a writing signal from the source line SL1 through the selection transistors 121*a* electrically connected to the source line SL1 and inputting a writing signal from the source line SL2 through the selection transistors 121*b* electrically connected to the source line SL2. At this time, a signal whose logic is the inverted logic of the source line SL2 is input to the source line SL1.

For example, the selection transistor 121*a* and the selection transistor 121*b* are turned on, a high-level potential is input from the source line SL1 through the selection transistor 121*a* and a low-level potential is input from the source line SL2 through the selection transistor 121*b*, whereby data can be written to the memory cell 181. The potential of a node connected to the input terminal of the inverter 182 is changed to the high-level potential, whereby the potential of a node connected to the output terminal of the inverter 182 is changed to the low-level potential. By holding this state, data can be stored in the memory cell 181.

Data is read from the memory cell 181 by detecting either or both a potential output to the source line SL1 through the selection transistors 121*a* electrically connected to the source lines SL1 or/and a potential output to the source line SL2 through the selection transistors 121*b* electrically connected to the source lines SL2.

For example, when the selection transistor 121*a* and the selection transistor 121*b* are turned on, data is read by detecting at least one of a potential output to the source line SL1 through the selection transistors 121*a* and a potential output to the source line SL2 through the selection transistors 121*b*.

Such a configuration does not need a capacitor in the memory cell, so that the writing operation and the reading operation can be performed at extremely high speed.

That is the description of the storage device including an SRAM element.

Configuration Example 3

In this configuration example, a storage device that has a different configuration from the above configuration examples is described.

Figure 11A:
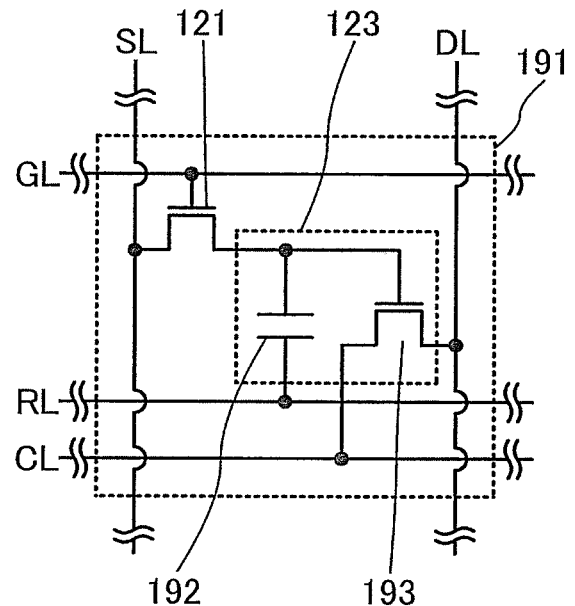
FIGS. 11A and 11B each illustrate a configuration example of a memory cell according to one embodiment of the present invention.

FIG. 11A illustrates a memory cell 191 of this configuration example. The memory cell 191 includes the selection transistor 121, a capacitor 192, and a transistor 193. The memory cell 191 are electrically connected to a data line DL for outputting read data and a read line RL for selecting a memory cell from which data is to be read, as well as a gate line GL, a source line SL, and a cathode line CL. Here, the configuration including the capacitor 192 and the transistor 193 corresponds to the functional element 123.

A gate of the selection transistor 121 is electrically connected to the gate line GL. A first terminal of the selection transistor 121 is electrically connected to the source line SL. A second terminal of the selection transistor 121 is electrically connected to first terminal of the capacitor 192 and a gate of the transistor 193. The second terminal of the capacitor 192 is electrically connected to the read line RL. A first electrode of the transistor 193 is electrically connected to the cathode line CL. A second electrode of the transistor 193 is electrically connected to the data line DL.

Data is written to the memory cell 191 by inputting a potential from the source line SL to a node connected to the first terminal of the capacitor 192 through the selection transistor 121.

Data is read from the memory cell 191 by detecting the potential of the data line DL with a sense amplifier or the like. For example, before performing a reading operation, it is preferable to precharge the data line DL with a high-level potential. Here, in the case of writing the high-level potential to the node, the transistor 193 is turned on, so that a potential close to a potential supplied to the cathode line CL in advance is output to the data line DL. In contrast, in the case of writing a low-level potential to the node, the transistor 193 is turned off, so that the potential of the data line DL is not changed and remains the high-level potential.

Here, a potential (e.g., a negative power supply potential) that is lower than the low-level potential is supplied to the read line RL in the memory cell 191 from which data is not read among the plurality of memory cells 191 that is connected to one data line DL. Accordingly, in the memory cell 191 from which data is not read, the transistor 193 is always off regardless of the potential written to the node connected to the first terminal of the capacitor 192. Thus, the memory cell 191 from which data is not read is made to be in a non-selected state, so that only data of a target memory cell can be read.

Figure 11B:
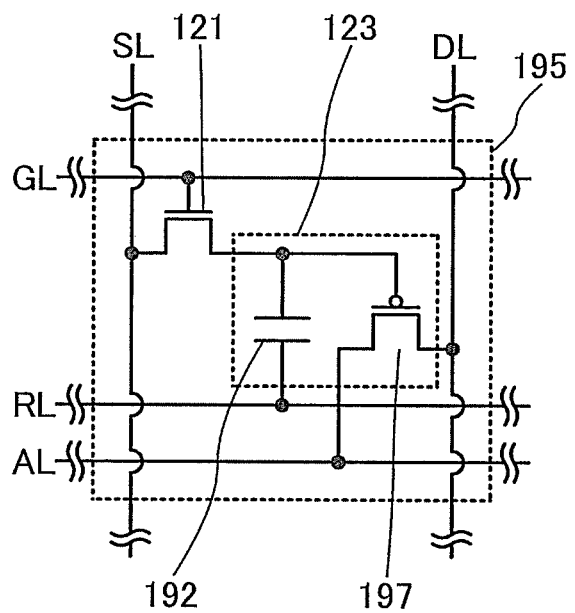

Here, as illustrated in FIG. 11B, the transistor 193 can be replaced with a p-channel transistor 197, so that reading can be performed without using a negative power supply potential.

A memory cell 195 illustrated in FIG. 11B has a different configuration from that of the memory cell 191 in that the transistor 193 is replaced with the p-channel transistor 197 and the cathode line CL is replaced with an anode line AL.

For data reading, a data line DL is precharged to have the low-level potential before the data reading starts. In the case where the high-level potential is written to a node connected to first terminal of the capacitor 192, the transistor 197 is turned off, so that the potential of the data line DL is not changed and remains the low-level potential. In contrast, in the case where the low-level potential is written to the node, the transistor 197 is turned on, so that a potential close to the potential of the anode line AL is output to the data line DL.

In contrast, in another memory cell 195 from which data is not read, the high-level potential is supplied to the read line RL. Then, the transistor 197 is turned off regardless of the potential written to the node, so that the memory cell 195 can be in a non-selected state.

With such a configuration, a power supply potential does not have to be increased, so that the circuit configuration can be simpler.

Here, a transistor whose off-state current is extremely low, as illustrated in Configuration Example 1, can be used as the selection transistor 121. Thus, a data-holding period can be extremely lengthened, so that the memory cell can be used for a substantially non-volatile storage device.

That is the description of the storage device illustrated in this configuration example.

The buffer circuit described in Embodiment 1 is applied to a storage device described in this embodiment. Thus, an on-state resistance of the selection transistor can be suppressed to be low, so that a data writing period is reduced and loss of a written potential can be suppressed. Further, a period required for writing, including a period prior to the start of the writing, can be extremely shortened; thus, a semiconductor device whose drive frequency is increased can be obtained. Furthermore, boost operation of the potential of a gate line GL connected to the buffer circuit is performed only in a selected state, and is not performed in a non-selected state; thus, a semiconductor device with reduced power consumption can be obtained.

This embodiment can be combined with any of the other embodiments and example described in this specification as appropriate.

Embodiment 3

In this embodiment, an example of a display device in which a serial signal is used as the image signal to markedly reduce the number of terminals is described with reference to drawings.

Figure 12A:
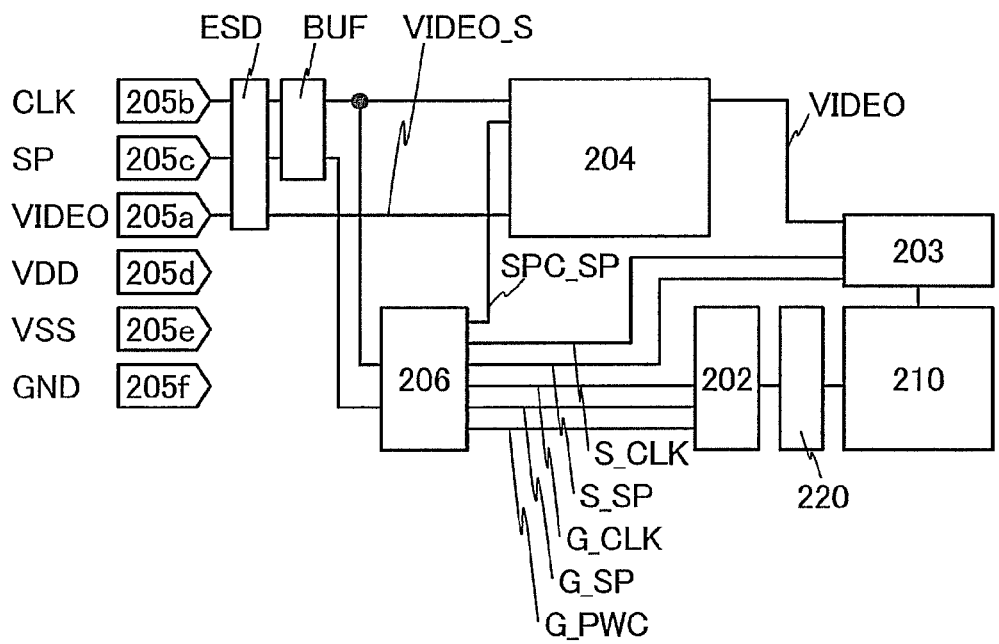
FIGS. 12A and 12B illustrate a configuration example of a display device according to one embodiment of the present invention.
Figure 12B:
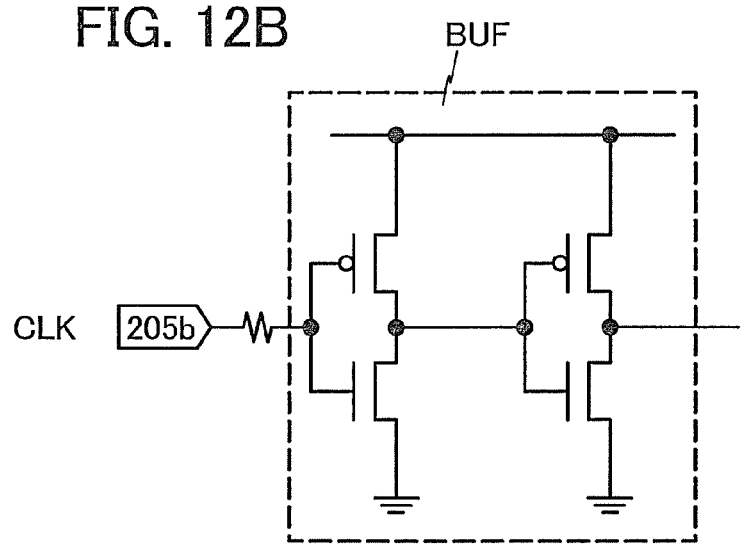

FIG. 12A illustrates a block diagram of a configuration of a display device 200. In the figure, ESD represents a protection circuit, and BUF represents an amplifier buffer circuit. FIG. 12B illustrates one example of an amplifier buffer circuit. With the amplifier buffer circuit, a waveform whose rising edge is gradual can be shaped.

The display device 200 includes a display portion 210 in which a plurality of pixels are provided in a matrix; a scan line driver circuit 202 electrically connected to the display portion 210; a signal line driver circuit 203 electrically connected to the display portion 210; a serial-parallel conversion circuit 204 which supplies a parallel signal to the signal line driver circuit 203; and a timing signal generation circuit 206 which outputs timing signals to the scan line driver circuit 202, the signal line driver circuit 203, and the serial-parallel conversion circuit 204.

A buffer circuit group 220 is positioned between the display portion 210 and the scan line driver circuit 202. The buffer circuit group 220 includes a plurality of the buffer circuits described in the above embodiments.

The serial-parallel conversion circuit 204 includes a transistor having a crystalline silicon film over a first substrate 201 over which the display portion 210 is formed. In the display device, when an RC load between a first external connection terminal 205a and the serial-parallel conversion circuit 204 is represented by RC, RC satisfies a formula (1).

$$RC < \frac{1}{H \cdot V \cdot fps \cdot \ln(2m)} \quad (1)$$

The first external connection terminal 205a is a terminal for inputting a serial signal VIDEO_S including an image signal from the outside of the display device 200. The serial signal VIDEO_S input to the first external connection terminal 205a is input to the serial-parallel conversion circuit 204.

A second external connection terminal 205b is a terminal for inputting a clock signal CLK from the outside of the display device 200. The input clock signal CLK is input to the timing signal generation circuit 206 and the serial-parallel conversion circuit 204.

A third external connection terminal 205c is a terminal for inputting a start pulse signal SP from the outside of the display device 200. The input start pulse signal SP is input to the timing signal generation circuit 206.

A fourth external connection terminal 205d is a terminal for inputting a high power supply potential Vdd from the outside of the display device 200. The high power supply potential Vdd is input to each element that needs the high power supply potential Vdd.

A fifth external connection terminal 205e is a terminal for inputting a low power supply potential VSS from the outside of the display device 200. The low power supply potential VSS is input to each element that needs the low power supply potential VSS.

A sixth external connection terminal 205f is a terminal for inputting a ground potential GND from the outside of the display device 200. The ground potential GND is input to each element that needs the ground potential GND.

The timing signal generation circuit 206 generates a serial-parallel conversion start pulse signal SPC_SP from the input clock signal CLK and the input start pulse signal SP to supply the serial-parallel conversion start pulse signal SPC_SP to the serial-parallel conversion circuit. Similarly, from the input clock signal CLK and the input start pulse signal SP, the timing signal generation circuit 206 generates a source clock signal S_CLK and a source start pulse signal S_SP to supply the source clock signal S_CLK and the source start pulse signal S_SP to the signal line driver circuit 203, and generates a gate clock signal G_CLK, a gate start pulse signal G_SP, and a pulse width control signal G_PWC to supply the gate clock signal G_CLK, the gate start pulse signal G_SP, and the pulse width control signal G_PWC to the scan line driver circuit 202.

The serial-parallel conversion circuit 204 generates a parallel signal VIDEO including an image signal from the input serial signal VIDEO_S and serial-parallel conversion start pulse signal SPC_SP to supply the parallel signal VIDEO to the signal line driver circuit 203.

The display device 200 exemplified in this embodiment includes the first external connection terminal for supplying a serial signal to the serial-parallel conversion circuit, the second external connection terminal for supplying a clock signal to the timing signal generation circuit, the third external connection terminal for supplying a start pulse signal to the timing signal generation circuit, the fourth external connection terminal to which a high power supply potential is supplied, the fifth external connection terminal to which a low power supply potential is supplied, and the sixth external connection terminal to which a ground potential is supplied. As a result, a self-luminous display device with high image quality and fewer terminals can be provided.

Figure 13A:
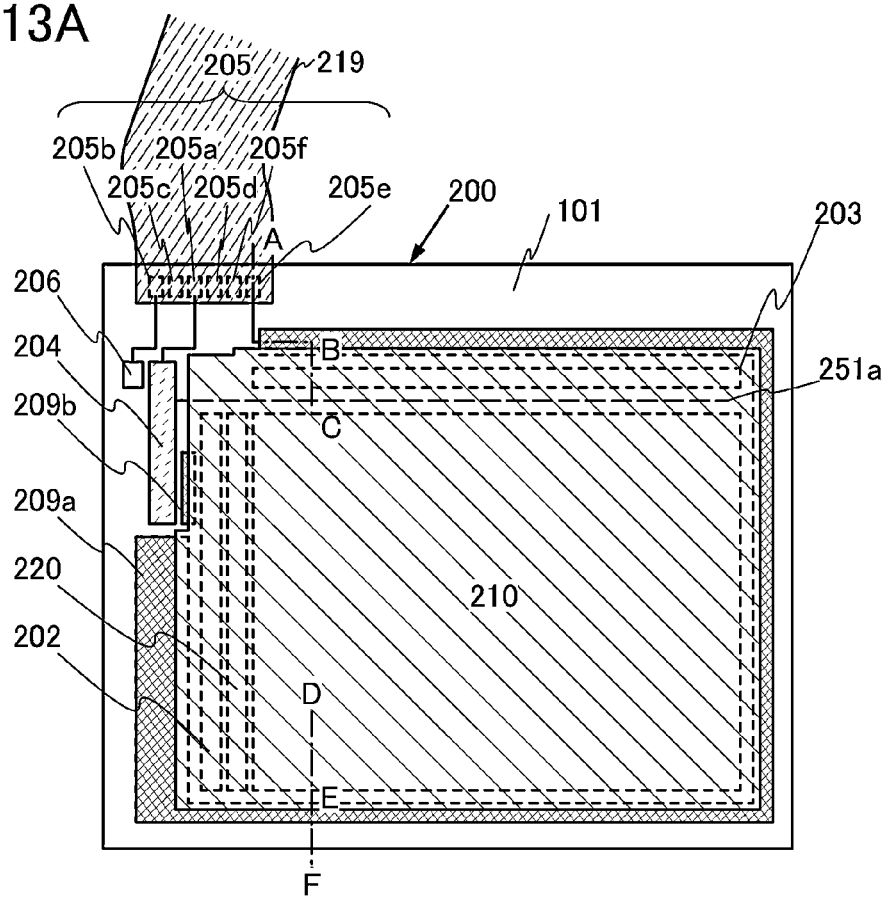
FIGS. 13A and 13B illustrate a structure example of a display device according to one embodiment of the present invention.
Figure 13B:
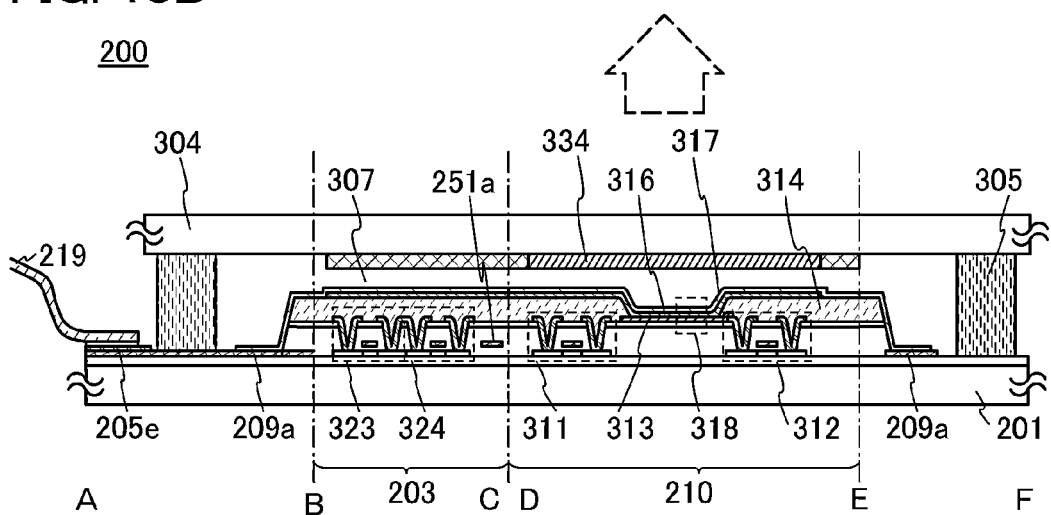

FIG. 13A is a schematic top view of the display device 200. FIG. 13B is a schematic cross-sectional view along the cutting plane lines A-B-C and D-E-F in FIG. 13A.

Note that in FIG. 13A, part of the structure shown in FIG. 13B is omitted for convenience of description. Specifically, a second substrate 304 provided with a color filter 334 and a sealing material 305 are omitted.

The display device 200 includes an external connection terminal group 205. The external connection terminal group 205 includes the first external connection terminal 205a, the second external connection terminal 205b, the third external connection terminal 205c, the fourth external connection terminal 205d, the fifth external connection terminal 205e, and the sixth external connection terminal 205f. Note that the external connection terminal group 205 is electrically connected to an external connection line 219.

The display device 200 includes a common connection portion 209a and a common connection portion 209b.

A cross section of the display device 200 is schematically illustrated in FIG. 13B. A cross section of one pixel in the display portion 210 is illustrated. One pixel includes a transistor 311, a transistor 312, and a light-emitting element 318. The light-emitting element 318 includes a first electrode 313, a second electrode 317, and a layer 316 containing a light-emitting organic compound between the electrodes.

One of the first electrode 313 and the second electrode 317 transmits light emitted from the layer 316 containing a light-emitting organic compound. In the light-emitting element 318 exemplified in this embodiment, the second electrode 317 has a light-transmitting property, and light is extracted from the second electrode 317 side.

The first electrode 313, the edge portion of which is covered with a partition wall 314, is electrically connected to a source electrode or a drain electrode of the transistor 312. The second electrode 317, which is extended to the outside of the display portion 210, is electrically connected to a common wiring through the common connection portion 209a. Note that the common wiring is electrically connected to the fifth external connection terminal 205e.

The signal line driver circuit 203 includes a transistor 323 and a transistor 324.

Transistors included in the pixels of the display portion 210, the signal line driver circuit 203, or the scan line driver circuit 202 and transistors included in the buffer circuit group 220, the serial-parallel conversion circuit 204, and the timing signal generating circuit 206 can be integrally formed in the same process. Thus, the number of steps is reduced, so that the display device 200 with high image quality can be easily manufactured.

Alternatively, the transistor included in the pixels of the display portion 210 may be formed in a step which is different from a step of forming the transistors included in the buffer circuit group 220, the serial-parallel conversion circuit 204, and the timing signal generating circuit 206. For example, a transistor having an amorphous semiconductor film, a transistor having a polycrystalline semiconductor film, or a transistor having an oxide semiconductor film can be used as the transistor included in the pixels of the display portion 210.

A typical example of an amorphous semiconductor is hydrogenated amorphous silicon. A typical example of a polycrystalline semiconductor is polysilicon (polycrystalline silicon). Examples of polysilicon include so-called high-temperature polysilicon which contains polysilicon as a main component and is formed at a process temperature greater than or equal to 800° C., so-called low-temperature polysilicon which contains polysilicon as a main component and is formed at a process temperature less than or equal to 600° C., polysilicon obtained by crystallizing amorphous silicon by using an element which promotes crystallization or the like, and the like. It is needless to say that a microcrystalline semiconductor or a semiconductor which includes a crystal phase in part of a semiconductor layer can also be used.

Further, an oxide semiconductor may be used. As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide. Further, any of the above oxide semiconductors may contain an element other than In, Ga, Sn, and Zn, for example, Si.

Here, for example, an In—Ga—Zn-based oxide semiconductor means an oxide semiconductor containing indium (In), gallium (Ga), and zinc (Zn), and there is no limitation on the composition ratio thereof.

The off-state current of a transistor including an oxide semiconductor film in a channel formation region can be very small, and the transistor can be used to form a memory element. Specifically, the transistor including the oxide semiconductor film is used as a selection transistor in each pixel of the display portion 210, and a source electrode or a drain electrode of the transistor is connected to a gate electrode of a driving transistor for driving a display element. Since the off-state current of the selection transistor in each pixel is very small, an image signal that is input is stored as a potential of the gate electrode of the driving transistor. Thus, the display portion 210 can have a memory function. Consequently, for example, the display portion 210 can store display data for one frame.

The display device 200 includes the second substrate 304 and the sealing material 305. The light-emitting element 318 in the display portion 210 is sealed in a space 307 enclosed by the first substrate 201, the second substrate 304, and the sealing material 305 surrounding the display portion 210.

On the second substrate 304 exemplified in this embodiment, the color filter 334 is provided to overlap with the pixel of the display portion 210. The light-emitting element 318 which emits white light is provided in the pixel. A color filter that transmits red light is provided in a pixel for red display, a color filter that transmits green light is provided in a pixel for green display, and a color filter that transmits blue light is provided in a pixel for blue display. Thus, a display device capable of full-color display can be provided.

Individual components included in the display device 200 of one embodiment of the present invention are described below. The display device 200 exemplified in this embodiment is an active-matrix display device; however, one embodiment of the present invention is not limited thereto and is applicable to a passive-matrix display device.

⟨Display Portion⟩

The display portion 210 includes a plurality of pixels including a plurality of sub-pixels. The display portion 210 includes V scan lines are each provided with H sub-pixels. Each pixel includes three sub-pixels (specifically, a pixel R for red display, a pixel G for green display, and a pixel B for blue display) which are not illustrated. Note that each pixel may include four or five sub-pixels in which a pixel W for white display and/or a pixel Y for yellow display are/is included in addition to the above.

The sub-pixels are provided at the intersections of the scan lines and the signal lines and operate in accordance with a selection signal input from the scan line and an image signal input from the signal line. Note that the sub-pixels exemplified in this embodiment each perform an m grayscale display.

The display device 200 displays an image in the display portion 210 at a frame rate fps.

⟨Scan Line Driver Circuit⟩

The scan line driver circuit 202 outputs a selection signal to each buffer circuit electrically connected to a scan line provided in the display portion 210.

⟨Signal Line Driver Circuit⟩

The signal line driver circuit 203 outputs an image signal to each of the signal lines provided in the display portion 210.

⟨Serial-Parallel Conversion Circuit⟩

The serial-parallel conversion circuit 204, which includes a transistor having a crystalline silicon film formed over the first substrate 201, converts the input serial signal to a parallel signal and outputs the parallel signal to the signal line driver circuit 203. Accordingly, the number of terminals can be reduced, a space and a wiring for bonding can be omitted, and a wiring can be further shortened.

Instead of the crystalline silicon film over the first substrate 201, any of a variety of single crystal semiconductors can be used. With the use of a single crystal semiconductor for a channel formation region of a transistor, the serial-parallel conversion circuit 204 can operate at high speed.

Typical examples of a single crystal semiconductor include semiconductor substrates such as single crystal semiconductor substrates including elements that belong to Group 14, such as a single crystal silicon substrate, a single crystal germanium substrate, and a single crystal silicon germanium substrate; and compound semiconductor substrates (such as an SiC substrate, a sapphire substrate, and a GaN substrate). Preferred one is a silicon on insulator (SOI) substrate in which a single crystal semiconductor layer is provided on an insulating surface.

As a method for forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect caused in the surface layer is eliminated; a method in which a semiconductor substrate is separated by utilizing the growth of microvoids, which are formed by hydrogen ion irradiation, by heat treatment; a method in which a single crystal semiconductor layer is formed on an insulating surface by crystal growth; and the like.

In this embodiment, ions are added through one surface of a single crystal semiconductor substrate, and an embrittlement layer is formed at a certain depth from the surface of the single crystal semiconductor substrate. Then, an insulating layer is formed over the surface of the single crystal semiconductor substrate or over the first substrate 201. Next, heat treatment is performed in the state in which the single crystal semiconductor substrate provided with the embrittlement layer and the first substrate 201 are bonded to each other with the insulating layer interposed therebetween, so that a crack is generated in the embrittlement layer to separate the single crystal semiconductor substrate along the embrittlement layer. Thus, a single crystal semiconductor layer, which is separated from the single crystal semiconductor substrate, is formed as a semiconductor layer over the first substrate 201. Note that a glass substrate can be used as the first substrate 201.

Regions electrically insulated from each other may be formed in a single crystal semiconductor substrate so that the electrically insulated semiconductor regions form the transistors included in the serial-parallel conversion circuit 204.

The transistor including a single crystal semiconductor in a channel formation is suitably used in a pixel of the display portion 210 together with the light-emitting element 318. This is because variation in electrical characteristics such as threshold voltage of the transistor, which is caused by bonding defects at grain boundaries, can be reduced. Accordingly, in the display device 200, the light-emitting element 318 can normally operate even if a circuit for compensating threshold voltage is not provided in each pixel. The number of circuit elements per pixel can therefore be reduced, increasing the flexibility in layout. Thus, a high-resolution light-emitting device can be achieved. For example, a display device having a matrix of a plurality of pixels, specifically 350 pixels or more per inch (i.e., the horizontal resolution is 350 pixels per inch (ppi) or more), more preferably 400 or more pixels per one inch (i.e., the horizontal resolution is 400 ppi or more) can be achieved.

Moreover, the transistor including the single crystal semiconductor in the channel formation region can be downsized while keeping high current drive capability. The use of the downsized transistor leads to a reduction in the area of a circuit portion that does not contribute to display operation, resulting in an increase in the area of a region of the display portion 210 where an image is displayed and a reduction in the frame size of the display device 200.

The signal line driver circuit 203 is provided along a row of the display portion 210, and the scan line driver circuit 202 is provided along a column of the display portion 210. The serial-parallel conversion circuit 204 is provided in a corner portion where the signal line driver circuit 203 and the scan line driver circuit 202 are close to each other; and the serial-parallel conversion circuit 204 is provided more apart from the display portion 210 (closer to the outer edge portion of the first substrate 201) than the scan line driver circuit 202 is. A signal line 251a, through which a parallel signal is supplied from the serial-parallel conversion circuit 204 to the signal line driver circuit 203, is provided between the display portion 210 and the signal line driver circuit 203, along the rows of the display portion 210.

Accordingly, a wiring for connecting the serial-parallel conversion circuit 204 to the signal line driver circuit 203 can be shortened as compared to other arrangement, whereby signal delay can be made less likely to occur. As a result, a display device with high image quality can be provided.

⟨RC Load RC⟩

An RC load RC between the first external connection terminal 205a and the serial-parallel conversion circuit 204 in the display device 200 exemplified in this embodiment is described.

It is necessary that settling time tset of the serial-parallel conversion circuit 204 be shorter than allowable time tsamp for transferring a signal to one sub-pixel.

Figure 14:
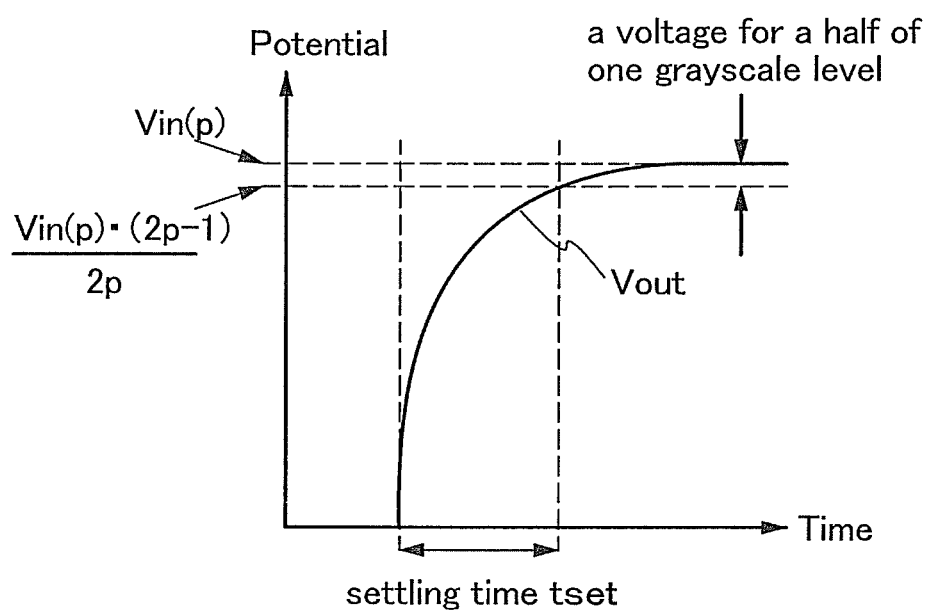
FIG. 14 is a graph for describing signal delay of a display device according to one embodiment of the present invention.

In the case where the RC load RC is present between the first external connection terminal 205a and the serial-parallel conversion circuit 204, a voltage Vin of a signal input to the first external connection terminal 205a is input to the serial-parallel conversion circuit 204 with delay (see FIG. 14). A voltage Vout input to the serial-parallel conversion circuit 204 with delay is expressed by the following formula (2).

$$\frac{Vout}{Vin} = \left(1 - \exp\left(-\frac{t}{RC}\right)\right) \quad (2)$$

Here, when the pth (p is greater than or equal to 1 and less than or equal to m) grayscale display is performed, the settling time tset of the serial-parallel conversion circuit 204 is defined as the time taken for the voltage Vout, which is the voltage of the signal input to the serial-parallel conversion circuit 204 with delay, to reach the value lower than the voltage Vin(p), which is the voltage of the signal input to the first external connection terminal 205a, by a voltage for a half of one grayscale level (see FIG. 14). The settling time tset can be expressed by the following formula (3).

$$tset = -RC \cdot \ln\left(1 - \frac{Vin(p) \cdot ((2p-1)/2p)}{Vin(p)}\right) = RC \cdot \ln(2p) \quad (3)$$

The allowable time tsamp for transferring one analog signal to one sub-pixel is expressed by the following formula (4).

$$tsamp = \frac{1}{H \cdot V \cdot fps} \quad (4)$$

It is necessary that the settling time tset be shorter than the allowable time tsamp for transferring the signal to one sub-pixel. Further, the settling time tset is longer as the value of the voltage Vin of the signal input to the first external connection terminal 205a is larger; the settling time tset is the maximum at the mth grayscale display is performed. Hence, in the display device 200, the RC load RC between the first external connection terminal 205a and the serial-parallel conversion circuit 204 satisfies the following formula (1).

$$RC < \frac{1}{H \cdot V \cdot fps \cdot \ln(2m)} \quad (1)$$

In the formula (1), H represents the number of sub-pixels in one scan line (also called the number of pixels in the horizontal direction), V represents the number of scan lines (also called the number of pixels in the vertical direction), fps represents a frame rate, and m represents the number of grayscale levels.

⟨Timing Signal Generating Circuit⟩

The timing signal generating circuit 206 includes a transistor having a crystalline silicon film over the first substrate 201. On the basis of the clock signal input to the second external connection terminal 205b and the start pulse signal input to the third external connection terminal 205c, the timing signal generating circuit 206 outputs the timing signals to the scan line driver circuit 202, the signal line driver circuit 203, and the serial-parallel conversion circuit 204.

In the display device 200, the timing signal generating circuit 206 includes the transistor, which includes the crystalline silicon film with high mobility in a channel formation region and thus operates at high speed, and can generate two or more timing signals from the clock signal supplied through the second external connection terminal 205b. Hence, the display device 200 can be driven using the two or more timing signals without an external connection terminal for a timing signal. As a result, the display device 200 with high image quality and fewer terminals can be provided.

In the display device 200, the timing signal generating circuit 206 is provided close to the second external connection terminal 205b, which supplies a clock signal, adjacent to the serial-parallel conversion circuit 204, and more apart from the display portion 210 than the serial-parallel conversion circuit 204 is. Accordingly, the length of a wiring for connecting the timing signal generating circuit 206 and the second external connection terminal 205b can be shorter than those in other arrangement, whereby delay can be made less likely to occur. As a result, a display device with high image quality and fewer terminals can be provided.

⟨Light-Emitting Element⟩

The light-emitting element 318 is provided in the sub-pixel of the display device 200. The light-emitting element 318 which is applicable to the display device 200 includes the first electrode 313, the second electrode 317, and the layer 316 containing a light-emitting organic compound between the electrodes. One of the first electrode 313 and the second electrode 317 is an anode, and the other thereof is a cathode. When a voltage higher than the threshold voltage of the light-emitting element 318 is applied between the first electrode 313 and the second electrode 317, holes are injected from the anode and electrons are injected from the cathode to the layer 316 containing a light-emitting organic compound. The injected holes and electrons are recombined, whereby the light-emitting organic compound emits light.

Here, a layer or a stacked body which includes one region where electrons and holes are recombined is referred to as a light-emitting unit. In the layer containing a light-emitting organic compound, at least one light-emitting unit can be included, and two or more light-emitting units may overlap with each other. For example, two light-emitting units are formed so that the color of light emitted from one of the two light-emitting units is complementary to the color of light emitted from the other of the two light-emitting units; thus, a light-emitting element that emits white light can be formed.

⟨Common Connection Portion⟩

The first electrode 313 of the light-emitting element 318 is provided over the first substrate 201 and supplied with power through the transistor 312. Note that the pixels in the display portion 210 have similar structures.

The second electrode 317 is extended to the outside of the display portion 210 and supplied with power through the common connection portions 209a and 209b. Here, the common connection portions 209a and 209b are provided so as to surround the display portion 210. Accordingly, a voltage drop due to a resistance component of the second electrode 317 can be suppressed in the entire display portion 210, whereby display unevenness can be reduced. As a result, a self-luminous display device with high image quality and fewer terminals can be achieved. Note that the common connection portions 209a and 209b are electrically connected to each other through a conductive layer which overlaps with the common connection portions 209a and 209b but is not shown.

In particular, in the case where the common connection portion 209a having a larger width than the serial-parallel conversion circuit 204 is provided on the serial-parallel conversion circuit 204 side of the display portion 210, the common connection portion 209a and the second electrode 317 are in contact with each other in a large area and electrical connection therebetween can be ensured. Further, the use of the common connection portion 209a having a larger width enables wiring resistance to be reduced.

The foregoing describes the display device 200 exemplified in this embodiment.

By using a serial signal as an image signal input to a display device having such a structure, the number of terminals in the display device can be extremely reduced.

In the display device 200 with the buffer circuit 101 described in the above embodiments, an additional power supply circuit for generating a power supply potential to turn on the selection transistor surely does not have to be provided and power consumption can be reduced. Further, without increasing the power supply potential for input to the gate of the selection transistor, the pixel can be performed at high speed.

This embodiment can be combined as appropriate with any of the other embodiments and example described in this specification.

Embodiment 4

In this embodiment, examples of an electronic device to which a display device or a storage device of one embodiment of the present invention is applied are described with reference to drawings.

A display device or a storage device described in the above embodiments can be applied to a variety of electronic devices. Examples of the electronic device to which the display device or the storage device is applied include television sets (also referred to as televisions or television receivers), monitors of computers or the like, digital cameras, digital video cameras, digital photo frames, cellular telephones (also referred to as cellular phones or cellular phone devices), portable game consoles, portable information terminals, audio reproducing devices, and large-sized game machines such as pachinko machines. The display device and the storage device described in the above embodiments have reduced power consumption for driving and are suitable for miniaturization; thus, they can be preferably used for a portable electronic device which drives by power supplied by a battery.

Figure 15A:
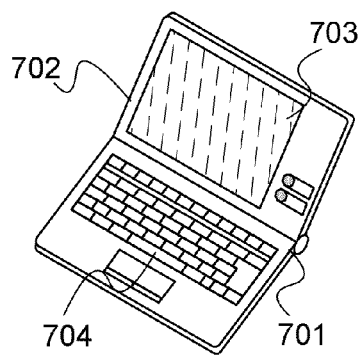
FIGS. 15A to 15F each illustrate a structure example of an electronic device according to one embodiment of the present invention.

FIG. 15A illustrates a notebook personal computer including a housing 701, a housing 702, a display portion 703, a keyboard 704, and the like. Each of the housings 701 and 702 is provided with the semiconductor device described in the above embodiments. Thus, a notebook personal computer with low power consumption that operates at high speed can be provided.

Figure 15D:
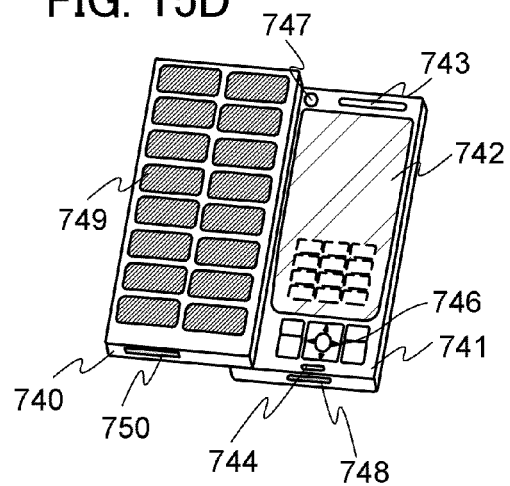
Figure 15B:
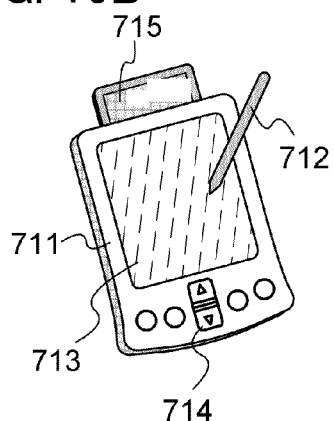

FIG. 15B illustrates a portable information terminal (PDA). A main body 711 is provided with a display portion 713, an interface 715, operation buttons 714, and the like. Further, a stylus 712 and the like for operation of the portable information terminal are provided. The main body 711 is provided with the semiconductor device described in the above embodiments. Thus, a portable information terminal with low power consumption that operates at high speed can be provided.

Figure 15E:
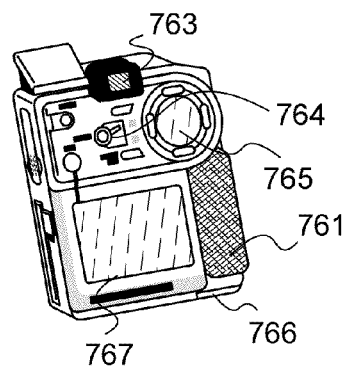
Figure 15C:
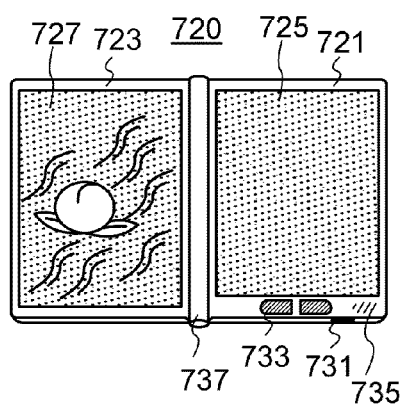

FIG. 15C illustrates an electronic book 720 including electronic paper, which includes two housings, a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power supply 731, an operation key 733, a speaker 735, and the like. At least one of the housing 721 and the housing 723 is provided with the semiconductor device described in the above embodiments. Thus, an electronic book with low power consumption that operates at high speed can be provided.

FIG. 15D illustrates a mobile phone set, which includes two housings, a housing 740 and a housing 741. Further, the housing 740 and the housing 741 in a state where they are developed as illustrated in FIG. 15D can shift by sliding so that one is lapped over the other. Therefore, the size of the mobile phone set can be reduced, which makes the mobile phone set suitable for being carried around. The housing 741 includes a display panel 742, a speaker 743, a microphone 744, a pointing device 746, a camera lens 747, an external connection terminal 748, and the like. The housing 740 includes a solar cell 749 for charging the cellular phone, an external memory slot 750, and the like. In addition, an antenna is incorporated in the housing 741. At least one of the housings 740 and 741 is provided with the semiconductor device described in the above embodiments. Thus, a mobile phone set with low power consumption that operates at high speed can be provided.

FIG. 15E illustrates a digital camera including a main body 761, a display portion 767, an eyepiece 763, an operation switch 764, a display portion 765, a battery 766, and the like. The main body 761 is provided with the semiconductor device described in the above embodiments. Thus, a digital camera with low power consumption that operates at high speed can be provided.

Figure 15F:
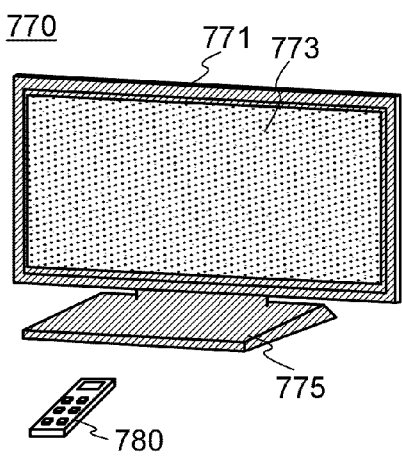

FIG. 15F illustrates a television set 770 including a housing 771, a display portion 773, a stand 775, and the like. The television set 770 can be operated with an operation switch of the housing 771 or a remote controller 780. The semiconductor device described in the above embodiments is mounted on the housing 771 and the remote controller 780. Thus, a television set with low power consumption that operates at high speed can be provided.

Figure 16A:
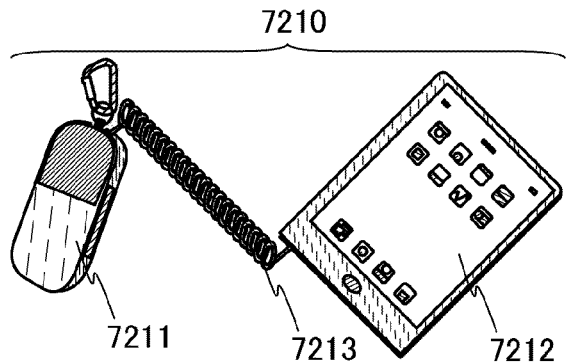
FIGS. 16A to 16C each illustrate a structure example of an electronic device according to one embodiment of the present invention.

FIG. 16A illustrates an example of a personal digital assistant. In a personal digital assistant 7210, a main body 7211 and a display device 7212 are connected to each other by a cable 7213. The cable 7213 transmits serial data including image data from the main body 7211 to the display device 7212 and transmits operation performed on the display device 7212 to the main body 7211. Further, the cable 7213 also has a function of preventing the display device from being damaged by being dropped.

Figure 16B:
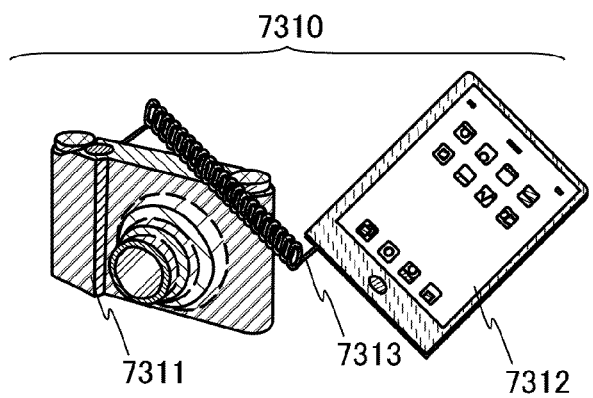

FIG. 16B illustrates an example of a digital camera. In a digital camera 7310, a main body 7311 and a display device 7312 are connected to each other by a cable 7313. The cable 7313 transmits serial data including image data from the main body 7311 to the display device 7312 and transmits operation performed on the display device 7312 to the main body 7311.

Figure 16C:
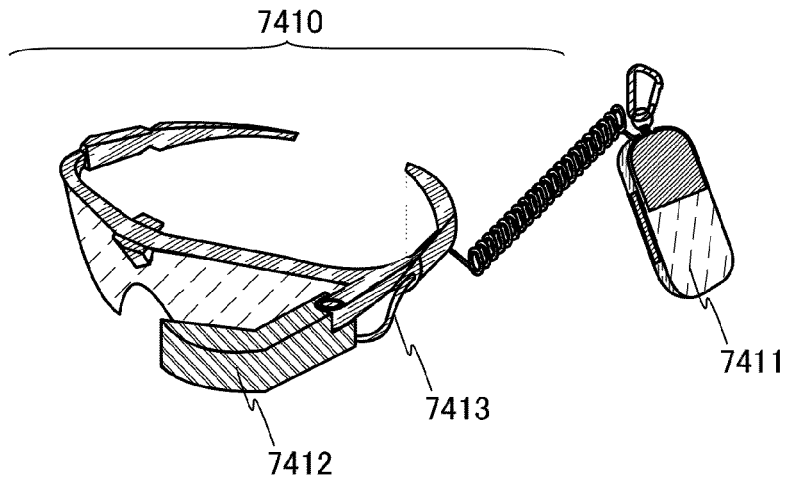

FIG. 16C illustrates an example of a head-mounted display. In a head-mounted display 7410, a main body 7411 and a display device 7412 are connected to each other by a cable 7413. The cable 7413 transmits serial data including image data from the main body 7411 to the display device 7412 set in a housing. Further, the movement of eyeball and eyelid of a user can be captured by a camera in the housing, and data on the movement can be transmitted to the main body 7411. From the data on the movement of the eyeball and the eyelid, coordinates of the points the user looks at are calculated in the main body 7411. Thus, the user can use the points for a pointing device.

In the display device of one embodiment of the present invention, the number of terminals is reduced, which leads to reduction in the number of wirings in a cable to be connected to an external device. In addition, the cable is bent with flexibility and the weight thereof is reduced. As a result, display can be seen with only a lightweight display portion held in a hand, for example, while a main body is put in a pocket or a bag. Further, the main body can be operated with the use of the display portion.

As described above, the electronic devices described in this embodiment each include the semiconductor device described in the above embodiments. Thus, an electronic device with low power consumption that operates at high speed can be provided. The number of power supply circuits or wirings can be reduced, so that the size of the device can be reduced. The case where power is supplied by a battery is especially preferable because driving period can be extended.

This embodiment can be combined with any of the other embodiments and example described in this specification as appropriate.

Example

Figure 17:
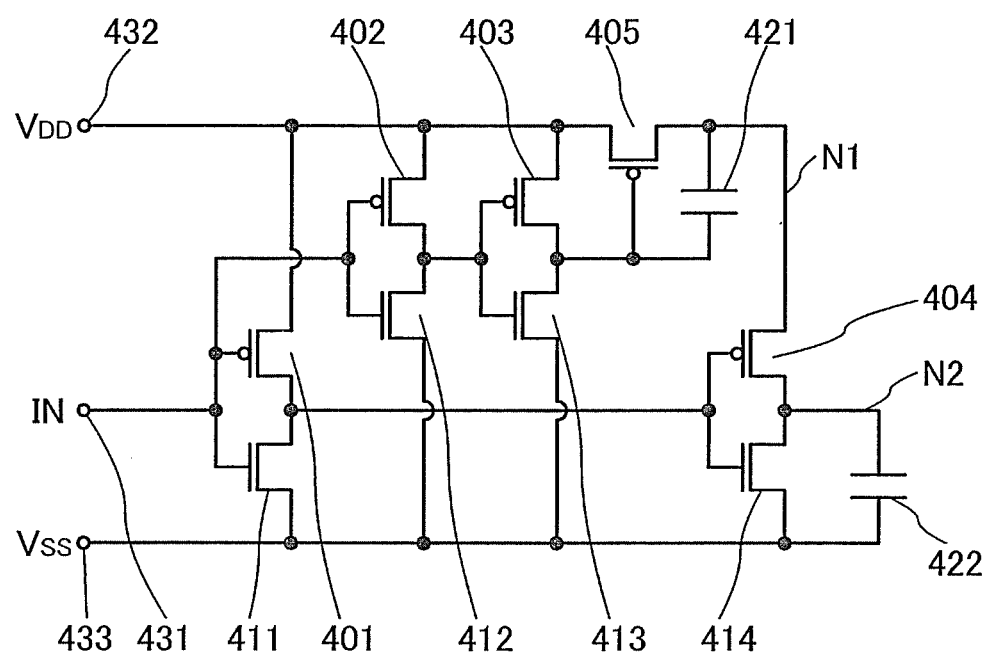
FIG. 17 illustrates a circuit according to Example.

In this example, the results of calculating input-output characteristics of a semiconductor device according to one embodiment of the present invention are described.
[Circuit Configuration]
First, a configuration of a circuit used for the calculation is described with reference to FIG. 17. FIG. 17 is a circuit diagram of this example.

The circuit includes a transistor 401, a transistor 402, a transistor 403, a transistor 404, a transistor 405, a transistor 411, a transistor 412, a transistor 413, a transistor 414, a capacitor 421, and a capacitor 422. The circuit further includes a terminal 431 to which an selection signal IN is input, a terminal 432 to which a high power supply potential VDD is supplied, and a terminal 433 to which a low power supply potential VSS is supplied.

Here, the transistor 401, the transistor 402, and the transistor 403, the transistor 404, the transistor 405 are p-channel transistors, and the transistor 411, the transistor 412, the transistor 413, and the transistor 414 are n-channel transistors.

A gate of the transistor 401 is connected to the terminal 431, a gate of the transistor 411, a gate of the transistor 402, and a gate of the transistor 412. A first terminal of the transistor 401 is connected to the terminal 432. A second terminal of the transistor 401 is connected to a first terminal of the transistor 411, a gate of the transistor 404, and a gate of the transistor 414. A second terminal of the transistor 411 is connected to the terminal 433. A first terminal of the transistor 402 is connected to the terminal 432. A second terminal of the transistor 402 is connected to a first terminal of the transistor 412, a gate of the transistor 403, and a gate of the transistor 413. A second terminal of the transistor 412 is connected to the terminal 433. A first terminal of the transistor 403 is connected to the terminal 432. A second terminal of the transistor 403 is connected to a first terminal of the transistor 413, a gate of the transistor 405, and a second terminal of the capacitor 421. A second terminal of the transistor 413 is connected to the terminal 433. A first terminal of the transistor 405 is connected to the terminal 432. A second terminal of the transistor 405 is connected to a first terminal of the capacitor 421 and a first terminal of the transistor 404. A second terminal of the transistor 404 is connected to a first terminal of the transistor 414 and a first terminal of the capacitor 422. A second terminal of the transistor 414 is connected to the terminal 433. A second terminal of the capacitor 422 is connected to the terminal 433.

Here, as transistor characteristics used for the calculation in this example, a variety of values of characteristics of transistors estimated from a measurement of a thin film transistor was used. A semiconductor layer of the thin film transistor was formed using a single crystal silicon film that was transferred on a glass substrate.

The channel length of each of the formed thin film transistors was 2 μm and the channel width thereof was 3 μm. The measured threshold voltage of each of the n-channel transistors was 0.73 V and the measured threshold voltage of each of the p-channel transistors was 1.49 V.

Further, as for the size (W/L: the ratio of the channel width (W) to the channel length (L)) of the p-channel transistors, when the transistor 401 is regarded as a reference, the size of the transistor 402 is one five hundredth that of the transistor 401, the transistors 403 and 405 have the same size as the transistor 401, and the size of the transistor 404 is double that of the transistor 401. In contrast, as for the size of the n-channel transistors, when the transistor 411 is regarded as a reference, the size of the transistor 412 is one two hundred fiftieth the size of the transistor 411, the size of the transistor 413 is the same as that of the transistor 401, and the size of the transistor 414 is double that of the transistor 411.

Further, as for a capacitance of the capacitors in the circuit, the capacitance of the capacitor 421 was 2.0 pF and the capacitance of the capacitor 422 was 5.0 pF.

Further, as for a potential input to the circuit, the high power supply potential VDD was 3.0 V and the low power supply potential VSS was 0V. As the selection signal IN, a pulsed signal having a high-level potential of 3.0 V and a low-level potential of 0V was used.

[Input-Output Characteristics]

Then, input-output characteristics calculated with the use of the circuit illustrated in FIG. 17 are described. In this example, a potential change over time of a node (node N1) connected to the first terminal of the transistor 404 and a potential change over time of a node (node N2, corresponding to the above described gate line GL) connected to the second terminal of the transistor 404 when a pulsed signal whose pulse width was 11.23 μsec. was input to the terminal 431 were calculated.

Figure 18A:
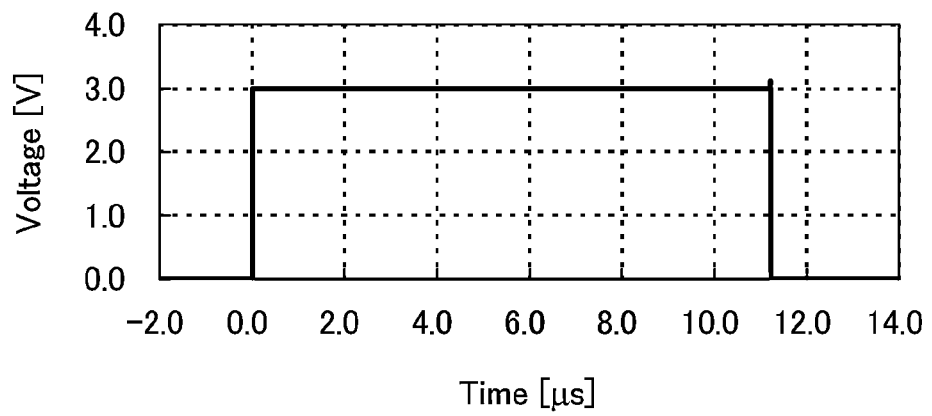
FIGS. 18A to 18C illustrate input-output characteristics according to Example.
Figure 18B:
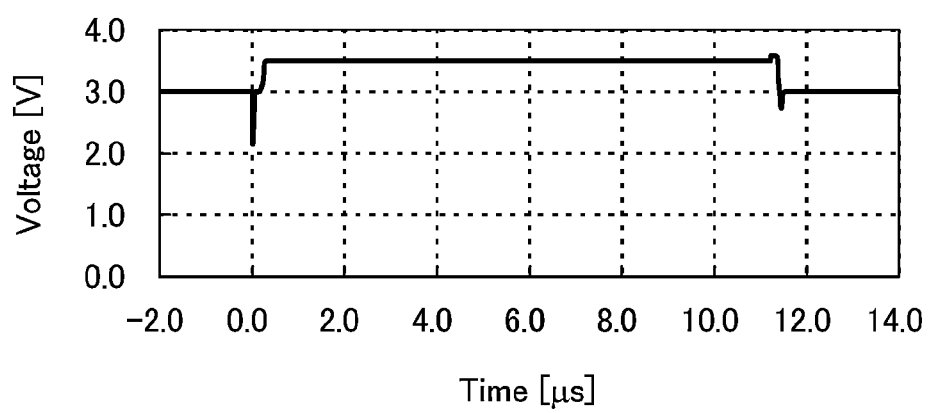
Figure 18C:
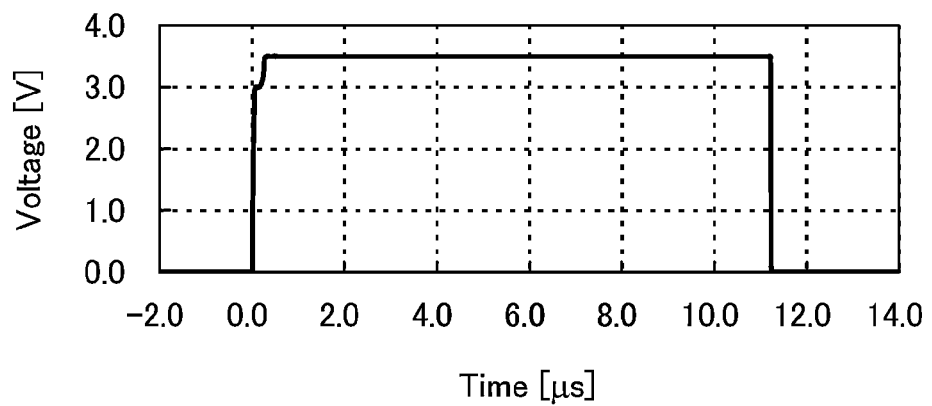
Figure 19A:
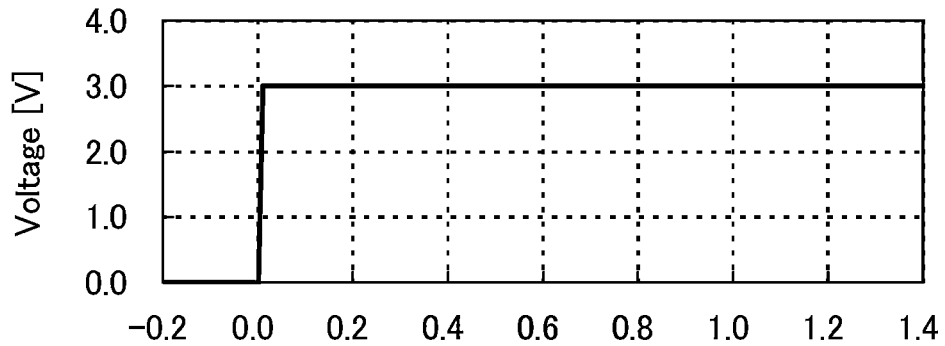
FIGS. 19A to 19C illustrate input-output characteristics according to Example.
Figure 19B:
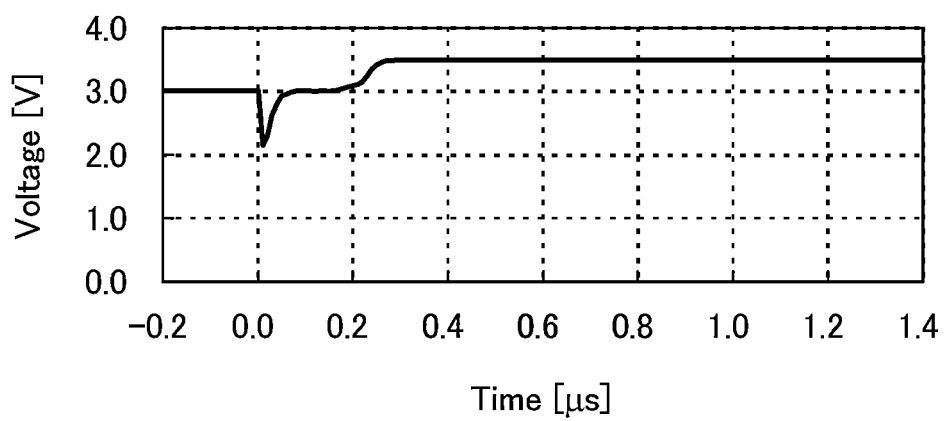
Figure 19C:
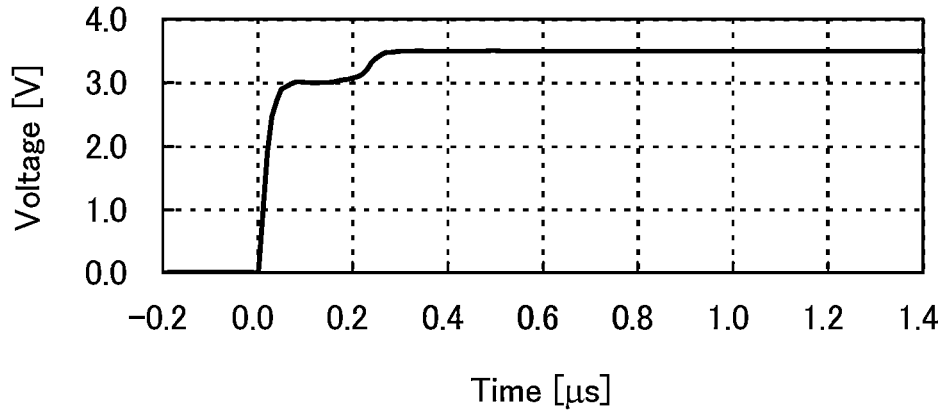

FIG. 18A shows a potential change over time of the selection signal IN that is input to the terminal 431. FIG. 18B shows a potential change over time of the node N1. FIG. 18C shows a potential change over time of the node N2. FIGS. 19A to 19C are graphs in which abscissa axes in FIGS. 18A to 18C are enlarged, respectively.

The selection signal IN with the potential of 3.0 V is held from 0 μsec. to 11.23 μsec.

Until just before the selection signal IN rises, the node N1 holds a potential of approximately 3.0 V. At the same time as the rise of the selection signal IN, the potential is decreased in a moment, but is back to approximately 3.0 V by 0.15 μsec. Further, the potential rapidly rises to approximately 3.5 V between 0.15 μsec and 0.30 μsec, and then the potential is maintained.

At the same time as the rise of the selection signal IN, the potential of the node N2 is increased to 3.0V. After that, at the same time as the rise of the potential of the node N1, the potential of the node N2 is increased to approximately 3.5 V, and then the potential is maintained.

The above results show that in the semiconductor device according to one embodiment of the present invention, after a selection signal IN is input, the potential of the gate line GL is increased to the high power supply potential VDD, the potential is then boosted to a potential higher than the high power supply potential VDD, and the potential can be maintained in a period during which a pulsed potential of the selection signal is input. The above results also show that the potential of the gate line GL can be boosted to a sufficiently high potential even in a case where a capacitance of the capacitor used for a bootstrap circuit in a circuit is smaller than that of a load capacitor connected to the gate line GL.

Thus, with the semiconductor device according to one embodiment of the present invention, a semiconductor device whose power consumption is low and in which data can be read at high speed without increasing a power supply potential can be achieved.

Note that this example can be implemented in combination with any of the embodiments described in this specification as appropriate.

This application is based on Japanese Patent Application serial No. 2012-095755 filed with Japan Patent Office on Apr. 19, 2012, the entire contents of which are hereby incorporated by reference.

What is claimed is:

1. A semiconductor device comprising:
a first circuit comprising a first transistor; and
a second circuit electrically connected to a gate of the first transistor through a first signal line, the second circuit comprising:
first to n-th inverters being sequentially connected in series, wherein n is a natural number larger than one;
a bootstrap circuit; and
a delay circuit,
wherein an input terminal of the first inverter is electrically connected to a wiring to which a selection signal is input,
wherein an output terminal of the n-th inverter is electrically connected to the first signal line,
wherein high-potential input terminals of the first to (n−1)th inverters are electrically connected to a second signal line to which a first potential is input,
wherein low-potential input terminals of the first to n-th inverters are electrically connected to a third signal line to which a second potential lower than the first potential is input,
wherein the delay circuit is configured to output a delay signal to the bootstrap circuit so as to start boosting by the bootstrap circuit at a timing later than a timing that the selection signal is input to the input terminal of the first inverter, and
wherein the bootstrap circuit is configured to output a third potential higher than the first potential to a high-potential input terminal of the n-th inverter in response to the delay signal.

2. A semiconductor device according to claim 1,
wherein the bootstrap circuit comprises an (n+2)th inverter, a capacitor, and a p-channel transistor,
wherein the delay signal is input to an input terminal of the (n+2)th inverter,
wherein an output terminal of the (n+2)th inverter is electrically connected to one terminal of the capacitor,
wherein a first terminal of the p-channel transistor is electrically connected to the second signal line,
wherein a second terminal of the p-channel transistor is electrically connected to the other terminal of the capacitor and the high-potential input terminal of the n-th inverter,
wherein a gate of the p-channel transistor is electrically connected to the output terminal of the (n+2)th inverter, and
wherein the bootstrap circuit is configured to turn off the p-channel transistor in response to the delay signal, and supply an output potential of the (n+2)th inverter to the one terminal of the capacitor in response to the delay signal, and then output the third potential to the high-potential input terminal of the n-th inverter.

3. An image display device comprising the semiconductor device according to claim 1, wherein the first circuit comprises a light-emitting element.

4. An image display device comprising the semiconductor device according to claim 1, wherein the first circuit comprises a liquid crystal element.

5. A storage device comprising the semiconductor device according to claim 1, wherein the first circuit comprises a storage element.

6. An electronic device comprising the semiconductor device according to claim 1.

7. An electronic device comprising the semiconductor device according to claim 1 further comprising a battery.

8. A semiconductor device comprising:
a first circuit comprising a first transistor; and
a second circuit electrically connected to a gate of the first transistor through a first signal line, the second circuit comprising:
first to n-th inverters being sequentially connected in series, wherein n is a natural number larger than one;
a bootstrap circuit; and
a delay circuit,
wherein an input terminal of the first inverter is electrically connected to a wiring to which a selection signal is input,
wherein an output terminal of the n-th inverter is electrically connected to the first signal line,
wherein high-potential input terminals of the first to (n−1)th inverters are electrically connected to a second signal line to which a first potential is input,
wherein low-potential input terminals of the first to n-th inverters are electrically connected to a third signal line to which a second potential lower than the first potential is input,
wherein the delay circuit is configured to output a delay signal to the bootstrap circuit so as to start boosting by the bootstrap circuit at a timing later than a timing that the selection signal is input to the input terminal of the first inverter,
wherein the bootstrap circuit is configured to output a third potential higher than the first potential to a high-potential input terminal of the n-th inverter in response to the delay signal, and
wherein the delay circuit comprises an (n+1)th inverter.

9. A semiconductor device according to claim 8,
wherein the bootstrap circuit comprises an (n+2)th inverter, a capacitor, and a p-channel transistor,
wherein the delay signal is input to an input terminal of the (n+2)th inverter,
wherein an output terminal of the (n+2)th inverter is electrically connected to one terminal of the capacitor,
wherein a first terminal of the p-channel transistor is electrically connected to the second signal line,
wherein a second terminal of the p-channel transistor is electrically connected to the other terminal of the capacitor and the high-potential input terminal of the n-th inverter,
wherein a gate of the p-channel transistor is electrically connected to the output terminal of the (n+2)th inverter, and
wherein the bootstrap circuit is configured to turn off the p-channel transistor in response to the delay signal, and supply an output potential of the (n+2)th inverter to the one terminal of the capacitor in response to the delay signal, and then output the third potential to the high-potential input terminal of the n-th inverter.

10. An image display device comprising the semiconductor device according to claim 8, wherein the first circuit comprises a light-emitting element.

11. An image display device comprising the semiconductor device according to claim 8, wherein the first circuit comprises a liquid crystal element.

12. A storage device comprising the semiconductor device according to claim 8, wherein the first circuit comprises a storage element.

13. An electronic device comprising the semiconductor device according to claim 8.

14. An electronic device comprising the semiconductor device according to claim 8 further comprising a battery.

* * * * *